(12) United States Patent
Jou et al.

(10) Patent No.: US 9,543,927 B2
(45) Date of Patent: *Jan. 10, 2017

(54) ELECTRONIC DEVICE WITH SWITCHED-CAPACITOR TUNING AND RELATED METHOD

(71) Applicant: Taiwan Semiconductor Manufacturing Company, Ltd., Hsin-Chu (TW)

(72) Inventors: Chewn-Pu Jou, Hsin-Chu (TW); Feng Wei Kuo, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/942,826

(22) Filed: Nov. 16, 2015

(65) Prior Publication Data

US 2016/0079962 A1  Mar. 17, 2016

Related U.S. Application Data

(63) Continuation of application No. 14/497,009, filed on Sep. 25, 2014, now Pat. No. 9,190,985, which is a
(Continued)

(51) Int. Cl.
| | |
|---|---|
| *H03J 5/02* | (2006.01) |
| *H03B 5/12* | (2006.01) |
| *H03J 5/24* | (2006.01) |
| *H03B 5/08* | (2006.01) |
| *H03H 5/12* | (2006.01) |

(52) U.S. Cl.
CPC ............... *H03J 5/0218* (2013.01); *H03B 5/08* (2013.01); *H03B 5/1215* (2013.01); *H03B 5/1228* (2013.01); *H03B 5/1265* (2013.01); *H03J 5/246* (2013.01); *H03B 2201/025* (2013.01); *H03H 5/12* (2013.01); *H03J 2200/10* (2013.01)

(58) Field of Classification Search
CPC ............ H03B 5/1265; H03B 2200/005; H03B 2201/025; H03B 2201/0266; H03J 5/24; H03J 5/242; H03J 5/244; H03J 5/246
USPC . 331/167, 117 R, 117 FE, 177 V, 179, 36 C; 334/55
See application file for complete search history.

(56) References Cited

U.S. PATENT DOCUMENTS 6,137,372 A  10/2000  Welland
7,012,470 B2  3/2006  Suzuki et al.
(Continued)

Primary Examiner — Ryan Johnson
(74) Attorney, Agent, or Firm — Slater Matsil, LLP

(57) ABSTRACT

A device comprises a first capacitor block comprising a plurality of first capacitors connected in a first configuration, a second capacitor block comprising a plurality of second capacitors connected in the first configuration, a third capacitor block comprising a plurality of third capacitors connected in a second configuration, a fourth capacitor block comprising a plurality of fourth capacitors connected in the second configuration, a first switch connected between the first capacitor block and the second capacitor block, a second switch connected between the third capacitor block and the fourth capacitor block, a third switch connected between the first capacitor block and the fourth capacitor block and a fourth switch connected between the third capacitor block and the second capacitor block.

20 Claims, 15 Drawing Sheets

Related U.S. Application Data continuation-in-part of application No. 13/902,392, filed on May 24, 2013, now Pat. No. 9,059,683.

(60) Provisional application No. 61/748,681, filed on Jan. 3, 2013.

(56) References Cited

U.S. PATENT DOCUMENTS

| | | |
|---|---|---|
| 8,138,845 B1 | 3/2012 | Zhang et al. |
| 8,188,797 B2 | 5/2012 | Moussavi |
| 8,248,157 B2 | 8/2012 | Thaller |
| 9,190,985 B2 * | 11/2015 | Jou ......... H03J 5/246 |
| 2010/0134195 A1 | 6/2010 | Lee et al. |
| 2014/0049330 A1 | 2/2014 | Martin |
| 2014/0184363 A1 | 7/2014 | Jou et al. |

* cited by examiner

ELECTRONIC DEVICE WITH SWITCHED-CAPACITOR TUNING AND RELATED METHOD

This application is a continuation of U.S. patent application Ser. No. 14/497,009, filed Sep. 25, 2014, and entitled "Electronic Device with Switched-Capacitor Tuning and Related Method," which is a continuation-in-part of U.S. patent application Ser. No. 13/902,392, now U.S. Pat. No. 9,059,683, filed May 24, 2013, and entitled "Electronic Device with Switched-Capacitor Tuning and Related Method," which claims priority to U.S. Provisional Application Ser. No. 61/748,681, filed on Jan. 3, 2013, entitled "Electronic Device with Switched-Capacitor Tuning and Related Method," which applications are hereby incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). As device dimensions shrink, voltage nodes also shrink, with modern core device voltages trending toward less than 1 Volt, and input/output (I/O) device voltages under 2 Volts.

Many types of analog, digital and mixed-signal circuits rely on tuning networks to achieve fine granularity in performance metrics, such as gain, bandwidth, center frequency, oscillation frequency, and the like. The tuning networks are often designed with a view to increase resolution while maintaining or shrinking area and also guarding against process, voltage, and temperature (PVT) variation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
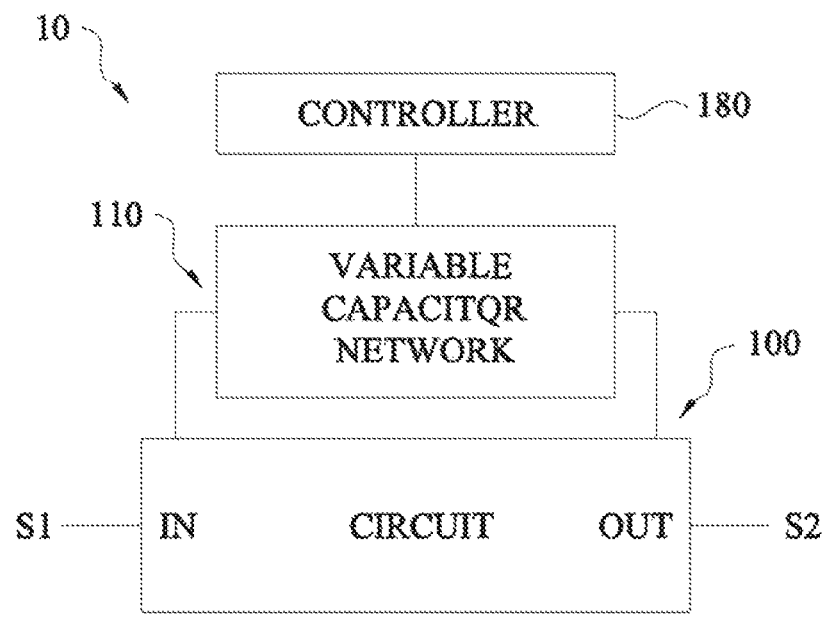
FIG. 1 is a circuit diagram of an electronic device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely an electronic circuit with switched-capacitor tuning, and the like. Other embodiments may also be applied, however, to other types of analog, digital, or mixed-signal circuits.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Analog, digital, and mixed-signal circuits are characterized by certain performance metrics, such as gain, direct current (DC) offset, bandwidth, center frequency, oscillator frequency, resolution, noise rejection, power consumption, and the like. Nearly every type of performance metric is controllable through proper circuit design. Constraints on circuit area and power consumption can impose trade-offs between the performance metrics defined for a circuit, such as an amplifier, a filter, a phase-locked loop (PLL), an analog-to-digital converter (ADC), a digital-to-analog converter (DAC), or the like. In many applications, tuning networks are included either to fine-tune a performance metric prior to shipping a final product, or to select an appropriate level for the performance metric on-the-fly. One example of the former would include a tunable bias circuit, such as a tunable current mirror, that tunes a low noise amplifier (LNA) for noise figure or input-referred third-order intercept point (IIP3). An example of the latter would be a variable capacitor used in an LC tank circuit for digitally controlling oscillation frequency of the LC tank circuit.

In the following disclosure, a novel electronic device with switched-capacitor tuning is introduced. The electronic device uses a switched-capacitor variable capacitance network to improve performance (e.g., resolution, PVT variation) of a circuit of the electronic device while maintaining low area. The circuit in conjunction with the switched-capacitor variable capacitance network exhibits high resolution, precise capacitance, and small area.

FIG. 1 is a circuit diagram of an electronic device 10 in accordance with various embodiments of the present disclosure. The electronic device 10 includes a circuit 100 and a variable capacitance network 110. In some embodiments, the circuit 100 has an input terminal for receiving a first signal S1, and an output terminal for outputting a second signal S2. In some embodiments, the variable capacitance network 110 has a first terminal electrically connected to a first internal node of the circuit 100, and a second terminal electrically connected to a second internal node of the circuit 100. In some embodiments, the first terminal is an inverting output terminal, and the second terminal is a non-inverting output terminal.

The circuit 100 is an analog circuit, a digital circuit, a mixed-signal circuit, a combination thereof, or the like. In some embodiments, the circuit 100 is a digitally-controlled oscillator (DCO) used with an all-digital phase-locked loop (ADPLL). In some embodiments, the circuit 100 is a filter. In some embodiments, the circuit 100 is a radio transceiver, an amplitude modulator, an analog-to-digital converter (ADC), an impedance matching network, a programmable gain amplifier, or the like.

Figure 2:
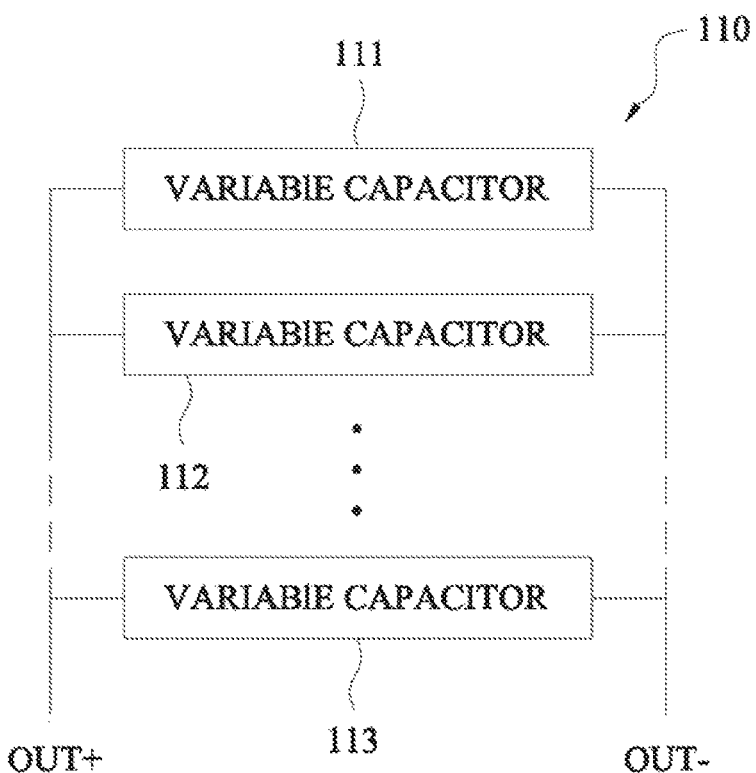
FIG. 2 is a diagram of the variable capacitor network in accordance with various embodiments of the present disclosure.

FIG. 2 is a diagram of the variable capacitor network 110 in accordance with various embodiments of the present disclosure. The variable capacitor network 110 includes variable capacitors 111, 112, . . . , 113 electrically connected in parallel. Number N of the variable capacitors 111, 112, . . . , 113 is a positive integer. The variable capacitor 111 is described as an example. In some embodiments, capacitance of the variable capacitor 111 is switchable between a first capacitance and a second capacitance. In some embodiments, the first capacitance is less than the second capacitance. A difference between the second capacitance and the first capacitance is a capacitance delta ($\Delta C$). In some embodiments, a single control signal is used to select the first capacitance or the second capacitance. The single control signal has at least two states, e.g. logic high or logic low, binary one or binary zero, on or off, or the like. In some embodiments, a first control signal and a second control signal are used to select the first capacitance or the second capacitance. The first control signal is inverse of the second control signal. When the first control signal is logic high, for example, the second control signal is logic low. When the first control signal is logic low, the second control signal is logic high. Other variable capacitors 112, . . . , 113 are operated similarly to the variable capacitor 111.

In some embodiments, first capacitances of the variable capacitors 111, 112, . . . , 113 are different (e.g., binary code, gray code), and second capacitances of the variable capacitors 111, 112, . . . , 113 are different (e.g., binary code, gray code). For example, the first capacitance of the variable capacitor 111 may be 16*C, and the first capacitance of the variable capacitor 112 may be 8*C, where C is a unit capacitance. In some embodiments, the first capacitances of the variable capacitors 111, 112, . . . , 113 are the same (e.g., thermometer code), and the second capacitances of the variable capacitors 111, 112, . . . , 113 are the same (e.g., thermometer code). In some embodiments, variable capacitors representing upper bits (e.g., most significant bits (MSBs)) of the variable capacitor network 110 have binary coded capacitances, and lower bits (e.g., least significant bits (LSBs)) of the variable capacitor network 110 have thermometer coded capacitances. In some embodiments, the capacitance deltas ($\Delta C$) of the variable capacitors 111, 112, . . . , 113 are thermometer-coded, binary-coded, hybrid-coded, or the like.

Total capacitance of the variable capacitor network 110 is equal to the sum of the individual capacitances of the variable capacitors 111, 112, . . . , 113. In some embodiments, a baseline capacitance $C_{max}$ of the variable capacitor network 110 is equal to the sum of the first capacitances of the variable capacitors 111, 112, . . . , 113. In some embodiments, a maximum capacitance $C_{max}$ of the variable capacitor network 110 is equal to the sum of the second capacitances of the variable capacitors 111, 112, . . . , 113. Resolution of the variable capacitor network 110 is determined by number and type of bits of the variable capacitors 111, 112, . . . , 113. For example, 64 discrete capacitances may be represented by 64 capacitor deltas having the thermal-coded capacitances (e.g., $\Delta C$, $\Delta C$, $\Delta C$, . . . , $\Delta C$), 6 capacitor deltas having binary-coded capacitances (e.g., 32*$\Delta C$, 16*$\Delta C$, 8*$\Delta C$, 4*$\Delta C$, 2*$\Delta C$, 1*$\Delta C$), or 7 capacitor deltas having hybrid-coded (binary and thermal) capacitances (e.g., 32*$\Delta C$, 16*$\Delta C$, 8*$\Delta C$, 4*$\Delta C$, $\Delta C$, $\Delta C$, $\Delta C$), where $\Delta C$ is a unit capacitance delta (e.g., 10 attofarads).

Figure 3:
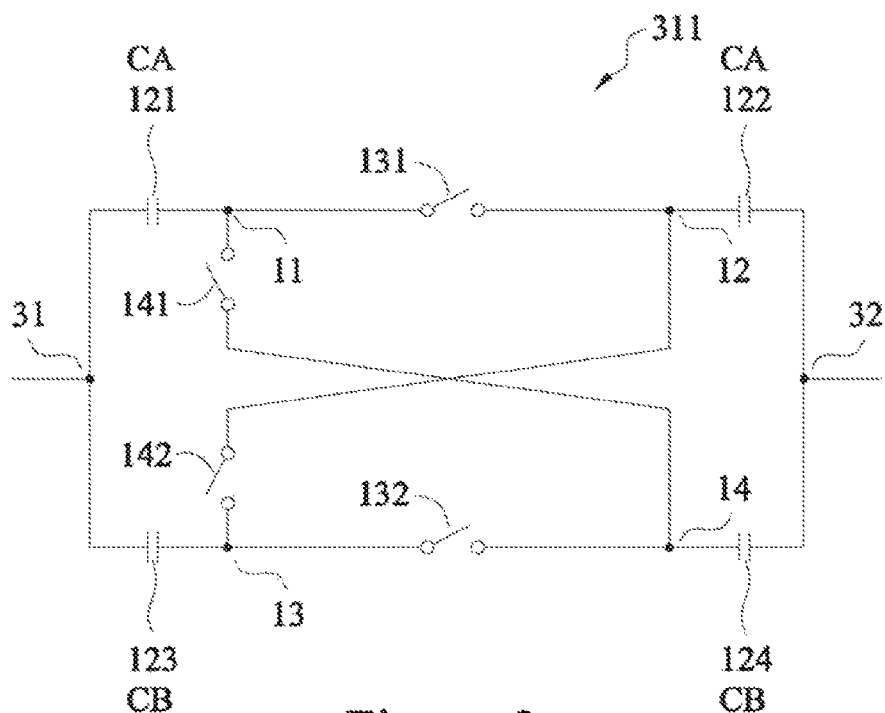
FIG. 3 is a diagram of a variable capacitor in accordance with various embodiments of the present disclosure.

FIG. 3 is a diagram of a variable capacitor 311 in accordance with various embodiments of the present disclosure. The variable capacitor 311 is an example of one type of variable capacitor that is used in some embodiments for the variable capacitors 111, 112, . . . , 113. A first terminal of a first capacitor 121 is electrically connected to a node 31 (e.g., a node OUT+ shown in FIG. 2). A second terminal of the first capacitor 121 is electrically connected to a node 11. The first capacitor 121 has a first capacitance CA (e.g., 1 femtofarad). A first terminal of a second capacitor 122 is electrically connected to a node 32 (e.g., a node OUT− shown in FIG. 2). A second terminal of the second capacitor 122 is electrically connected to a node 12. In some embodiments, the second capacitor 122 has the first capacitance CA. In some embodiments, the second capacitor 122 has a different capacitance than the first capacitor 121. A first switch 131 has a first terminal electrically connected to the node 11. A second terminal of the first switch 131 is electrically connected to the node 12. In some embodiments, the first switch 131 is controllable by an electrical signal. In some embodiments, the first switch 131 is an N-type metal-oxide semiconductor (NMOS) transistor, a P-type metal-oxide-semiconductor (PMOS) transistor, a pass gate, or the like. When the first switch 131 is closed (turned on, short-circuited), the second terminal of the first capacitor 121 is electrically connected to the second terminal of the second capacitor 122. When the first switch 131 is open (turned off, open-circuited), the second terminal of the first capacitor 121 is electrically isolated from the second terminal of the second capacitor 122.

A first terminal of a third capacitor 123 is electrically connected to the node 31. A second terminal of the third capacitor 123 is electrically connected to a node 13. The third capacitor 123 has a second capacitance CB (e.g., 1.2 femtofarads). A first terminal of a fourth capacitor 124 is electrically connected to a node 32. A second terminal of the fourth capacitor 124 is electrically connected to a node 14. In some embodiments, the fourth capacitor 124 has the second capacitance CB. In some embodiments, the fourth capacitor 124 has a different capacitance than the third capacitor 123. A second switch 132 has a first terminal electrically connected to the node 13. A second terminal of the second switch 132 is electrically connected to the node 14. In some embodiments, the second switch 132 is controllable by an electrical signal. In some embodiments, the second switch 132 is an N-type metal-oxide semiconductor (NMOS) transistor, a P-type metal-oxide-semiconductor (PMOS) transistor, a pass gate, or the like. When the second switch 132 is closed (turned on, short-circuited), the second terminal of the third capacitor 123 is electrically connected to the second terminal of the fourth capacitor 124. When the second switch 132 is open (turned off, open-circuited), the second terminal of the third capacitor 123 is electrically isolated from the second terminal of the fourth capacitor 124.

A first terminal of a third switch 141 is electrically connected to the node 11, and a second terminal of the third switch 141 is electrically connected to the node 14. In some embodiments, the third switch 141 is controllable by an electrical signal. In some embodiments, the third switch 141 is an N-type metal-oxide semiconductor (NMOS) transistor, a P-type metal-oxide-semiconductor (PMOS) transistor, a pass gate, or the like. When the third switch 141 is closed (turned on, short-circuited), the second terminal of the first capacitor 121 is electrically connected to the second terminal of the fourth capacitor 124. When the third switch 141 is open (turned off, open-circuited), the second terminal of the first capacitor 121 is electrically isolated from the second terminal of the fourth capacitor 124.

A first terminal of a fourth switch 142 is electrically connected to the node 12, and a second terminal of the fourth switch 142 is electrically connected to the node 14. In some embodiments, the fourth switch 142 is controllable by an electrical signal. In some embodiments, the fourth switch 142 is an N-type metal-oxide semiconductor (NMOS) transistor, a P-type metal-oxide-semiconductor (PMOS) transistor, a pass gate, or the like. When the fourth switch 142 is closed (turned on, short-circuited), the second terminal of the third capacitor 123 is electrically connected to the second terminal of the second capacitor 122. When the fourth switch 142 is open (turned off, open-circuited), the second terminal of the third capacitor 123 is electrically isolated from the second terminal of the second capacitor 122.

In some embodiments, the first capacitor 121, the second capacitor 122, the third capacitor 123, and the fourth capacitor 124 are integrated capacitors, such as metal-oxide-metal (MOM) capacitors, metal-insulator-metal (MIM) capacitors, polysilicon capacitors, or the like.

Figure 4:
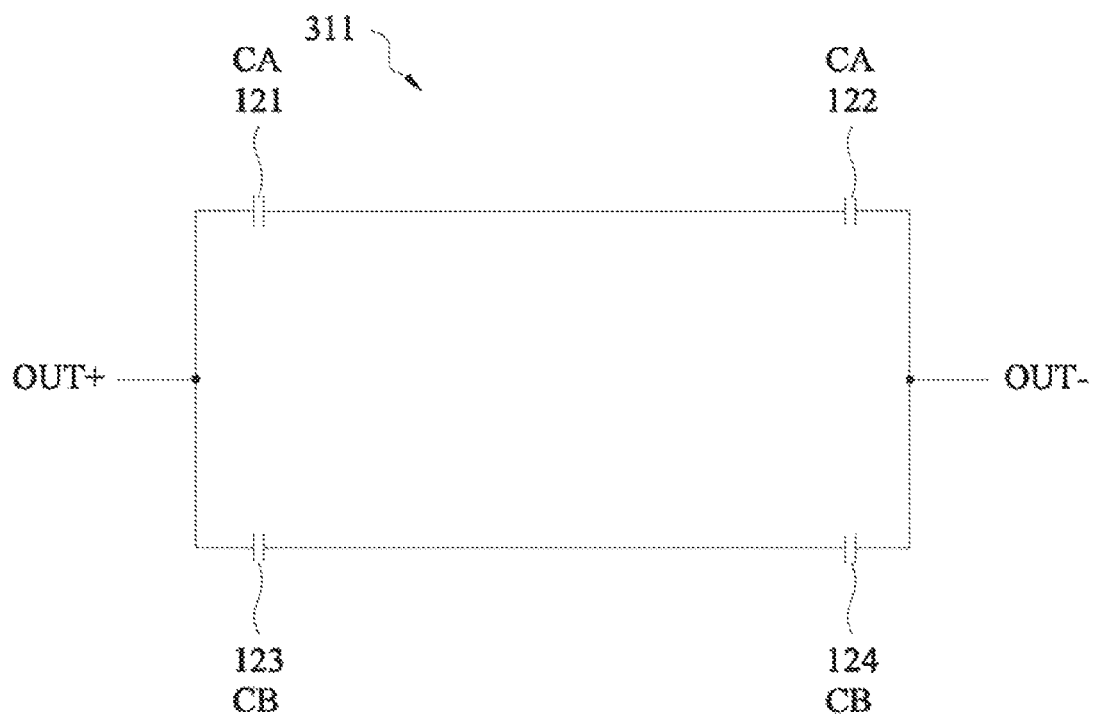
FIG. 4 is a diagram of the variable capacitor having the first capacitance in accordance with various embodiments of the present disclosure.
Figure 5:
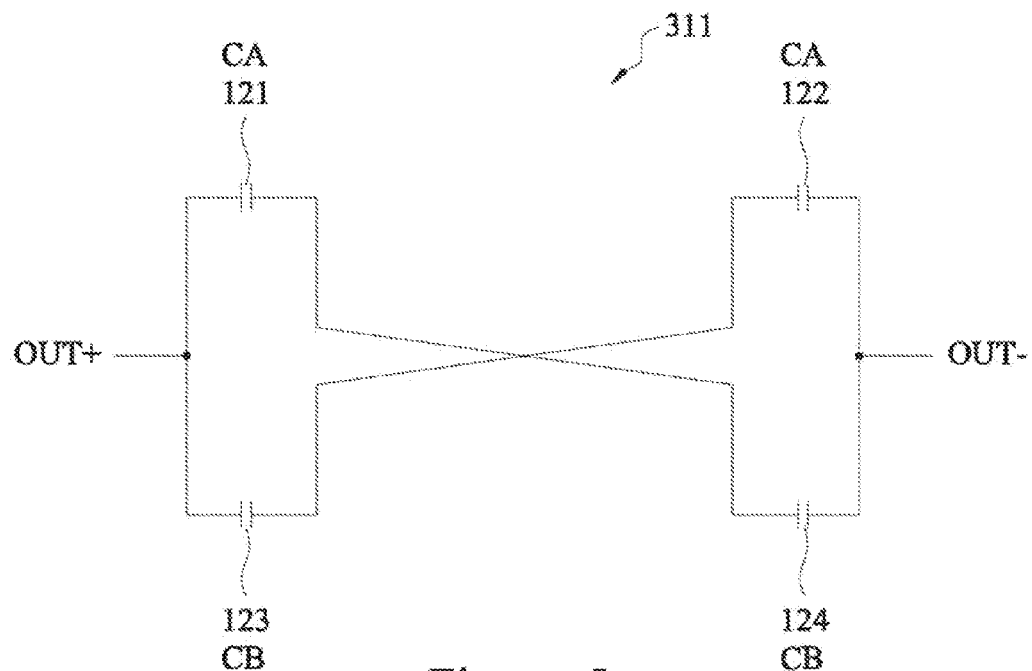
FIG. 5 is a diagram of the variable capacitor having the second capacitance in accordance with various embodiments of the present disclosure.

FIG. 4 is a diagram of the variable capacitor 311 having the first capacitance in accordance with various embodiments of the present disclosure. FIG. 5 is a diagram of the variable capacitor 311 having the second capacitance in accordance with various embodiments of the present disclosure. In FIG. 4, the first switch 131 is closed, the second switch 132 is closed, the third switch 141 is open, and the fourth switch 142 is open. In this configuration, the capacitance $C_{311}$ of the variable capacitor 311 is given by the following formula:

$$C_{311} = \frac{C_A}{2} + \frac{C_B}{2} \qquad (1)$$

where $C_A$ is capacitance of the first capacitor 121 and capacitance of the second capacitor 122, and $C_B$ is capacitance of the third capacitor 123 and capacitance of the fourth capacitor 124.

In FIG. 5, the first switch 131 is open, the second switch 132 is open, the third switch 141 is closed, and the fourth switch 142 is closed. In this configuration, the capacitance $C_{311}$ of the variable capacitor 311 is given by the following formula:

$$C_{311} = \frac{2C_A C_B}{C_A + C_B} \qquad (2)$$

Based on formula (1) and formula (2), the capacitance delta ($\Delta C$) of the variable capacitor 311 is given by the following formula:

$$\Delta C = \frac{(C_B - C_A)^2}{2(C_B + C_A)} \qquad (3)$$

Assuming $C_B$ is n times $C_A$, formula (3) can be rewritten in terms of n as:

$$\Delta C = \frac{(n-1)^2}{2(n+1)} C_A \qquad (4)$$

Using formula (4), it can be seen that for $C_A$ of 1 fF and n of 1.2 ($C_B$=1.2 fF), the capacitance delta $\Delta C$ is approximately 9.1 aF.

Figure 6:
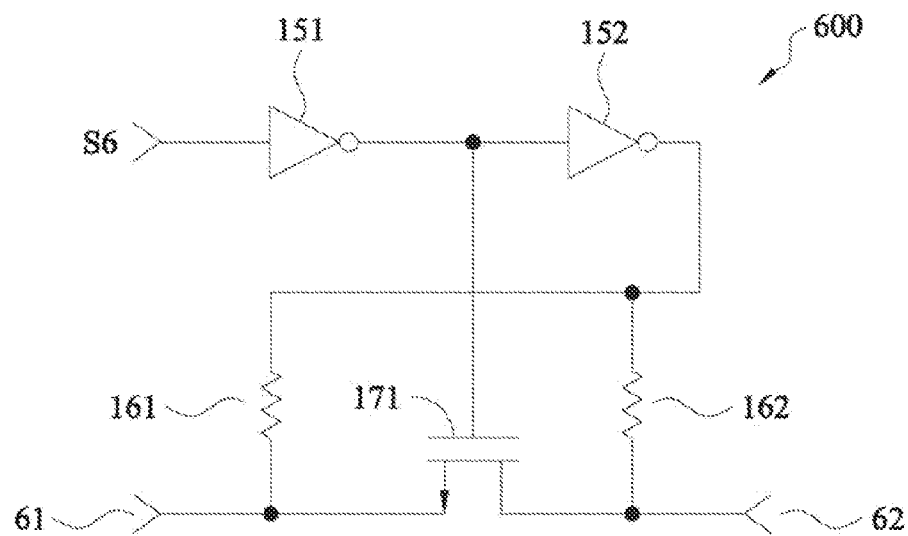
FIGS. 6 and 7 are diagrams of switch circuits in accordance with various embodiments of the present disclosure.
Figure 7:
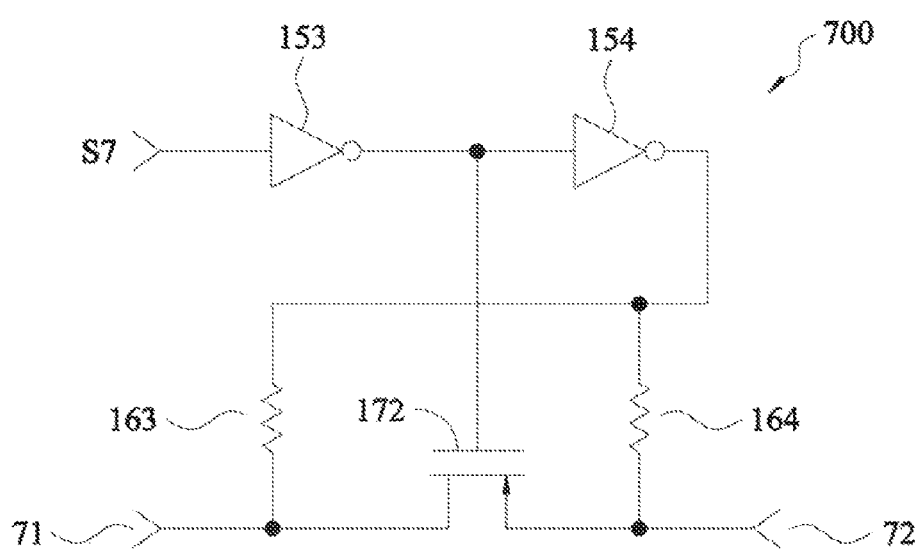

FIGS. 6 and 7 are diagrams of switch circuits 600, 700 in accordance with various embodiments of the present disclosure. The switch circuit 600 has inverted operation relative to the switch circuit 700. For example, when the switch circuit 600 is turned on, the switch circuit 700 is turned off. In some embodiments, the switch circuit 600 is used as the switches 131, 132 of the variable capacitor 311, and the switch circuit 700 is used as the switches 141, 142 of the variable capacitor 311. As such, nodes 61 and 62 may correspond to nodes 11 and 12 (or nodes 13 and 14), respectively. Nodes 71 and 72 may correspond to nodes 11 and 14 (or nodes 13 and 12), respectively.

A switch control signal S6 controls turning on or turning off of the switch circuit 600. A first inverter 151 of the switch circuit 600 receives the switch control signal S6, and inverts the switch control signal S6 to output an inverted switch control signal at an output terminal of the first inverter 151. A second inverter 152 receives the inverted switch control signal at an input terminal of the second inverter 152, and inverts the inverted switch control signal to output a signal having the same logical polarity as the switch control signal S6 at an output terminal of the second inverter 152. A switching transistor 171 is an NMOS transistor in some embodiments, and has a gate electrode electrically connected to the output terminal of the first inverter 151 for receiving the inverted switch control signal. A first resistor 161 has a first terminal electrically connected to the output terminal of the second inverter 152. A second terminal of the first resistor 161 is electrically connected to a source electrode of the switching transistor 171 (e.g., at the node 61). A second resistor 162 has a first terminal electrically connected to the output terminal of the second inverter 152. A second terminal of the second resistor 162 is electrically connected to a drain electrode of the switching transistor 171 (e.g., at the node 62). The first resistor 161 and the second resistor 162 act as alternating current (AC) chokes. In some embodiments, the first resistor 161 has impedance much greater than drain-source resistance ($R_{DS}$) of the transistor 171. For example, resistance of the first resistor 161 may be 10, 100, or 1000 times the drain-source resistance of the transistor 171. In some embodiments, the second resistor 162 has impedance much greater than the drain-source resistance ($R_{DS}$) of the transistor 171. For example, resistance of the second resistor 162 may be 10, 100, or 1000 times the drain-source resistance of the transistor 171. In some embodiments, the resistance of the first resistor 161 is substantially the same as the resistance of the second resistor 162. In some embodiments, an integrated inductor is used in place of, or in addition to, the first resistor 161 or the second resistor 162. In some embodiments, the first resistor 161 and the second resistor 162 are polysilicon resistors, titanium-nitride (TiN) resistors, or the like.

A switch control signal S7 controls turning on or turning off of the switch circuit 700. A first inverter 153 of the switch circuit 700 receives the switch control signal S7, and inverts the switch control signal S7 to output an inverted switch control signal at an output terminal of the first inverter 153. A second inverter 154 receives the inverted switch control signal at an input terminal of the second inverter 154, and inverts the inverted switch control signal to output a signal having the same logical polarity as the switch control signal S7 at an output terminal of the second inverter 154. A switching transistor 172 is a PMOS transistor in some embodiments, and has a gate electrode electrically connected to the output terminal of the first inverter 153 for receiving the inverted switch control signal. A first resistor 163 has a first terminal electrically connected to the output terminal of the second inverter 154. A second terminal of the first resistor 163 is electrically connected to a source electrode of the switching transistor 172 (e.g., at the node 71). A second resistor 164 has a first terminal electrically connected to the output terminal of the second inverter 154. A second terminal of the second resistor 164 is electrically connected to a drain electrode of the switching transistor 172 (e.g., at the node 72). The first resistor 163 and the second resistor 164 act as alternating current (AC) chokes. In some embodiments, the first resistor 163 has impedance much greater than drain-source resistance ($R_{DS}$) of the transistor 172. For example, resistance of the first resistor 163 may be 10, 100, or 1000 times the drain-source resistance of the transistor 172. In some embodiments, the second resistor 164 has impedance much greater than the drain-source resistance ($R_{DS}$) of the transistor 172. For example, resistance of the second resistor 164 may be 10, 100, or 1000 times the drain-source resistance of the transistor 172. In some embodiments, the resistance of the first resistor 163 is substantially the same as the resistance of the second resistor 164. In some embodiments, an integrated inductor is used in place of, or in addition to, the first resistor 163 or the second resistor 164. In some embodiments, the first resistor 163 and the second resistor 164 are polysilicon resistors, titanium-nitride (TiN) resistors, or the like.

Figure 8:
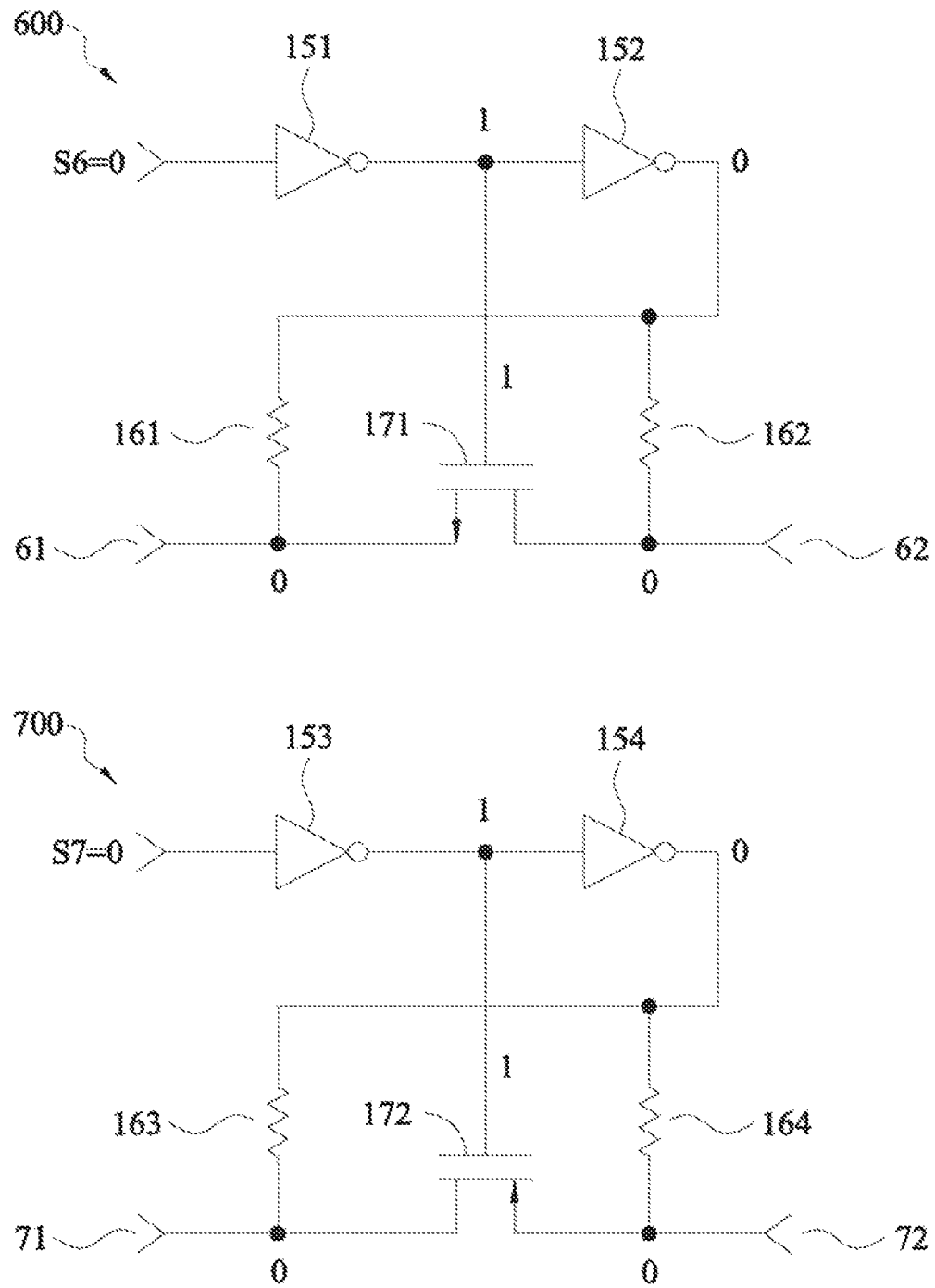
FIGS. 8, 9, 10 and 11 are diagrams of operating modes of the switch circuits in accordance with various embodiments of the present disclosure.

FIGS. 8, 9, 10 and 11 are diagrams of operating modes of the switch circuits 600, 700 in accordance with various embodiments of the present disclosure. In some embodiments, the switch control signal S6 and the switch control signal S7 are the same signal, or have the same logical polarity. As shown in FIG. 8, the switch control signals S6, S7 have the logical polarity 0 (e.g., low voltage). As a result, the gate electrode of the transistor 171 has the logical polarity 1 (e.g., high voltage), and the source and drain electrodes of the transistor 171 have the logical polarity 0 (e.g., low voltage). Positive gate-source voltage ($V_{GS}$) of the transistor 171 turns on the transistor 171, electrically connecting the node 61 to the node 62 of the switch circuit 600. In the switch circuit 700, the gate electrode of the transistor 172 has the logical polarity 1 (e.g., high voltage) when the switch control signal S7 has the logical polarity 0 (e.g., low voltage). The source and drain electrodes of the transistor 172 have the logical polarity 0 (e.g., low voltage). Negative source-gate voltage ($V_{SG}$) of the transistor 172 turns off the transistor 172, electrically isolating the node 71 from the node 72 of the switch circuit 700.

Figure 9:
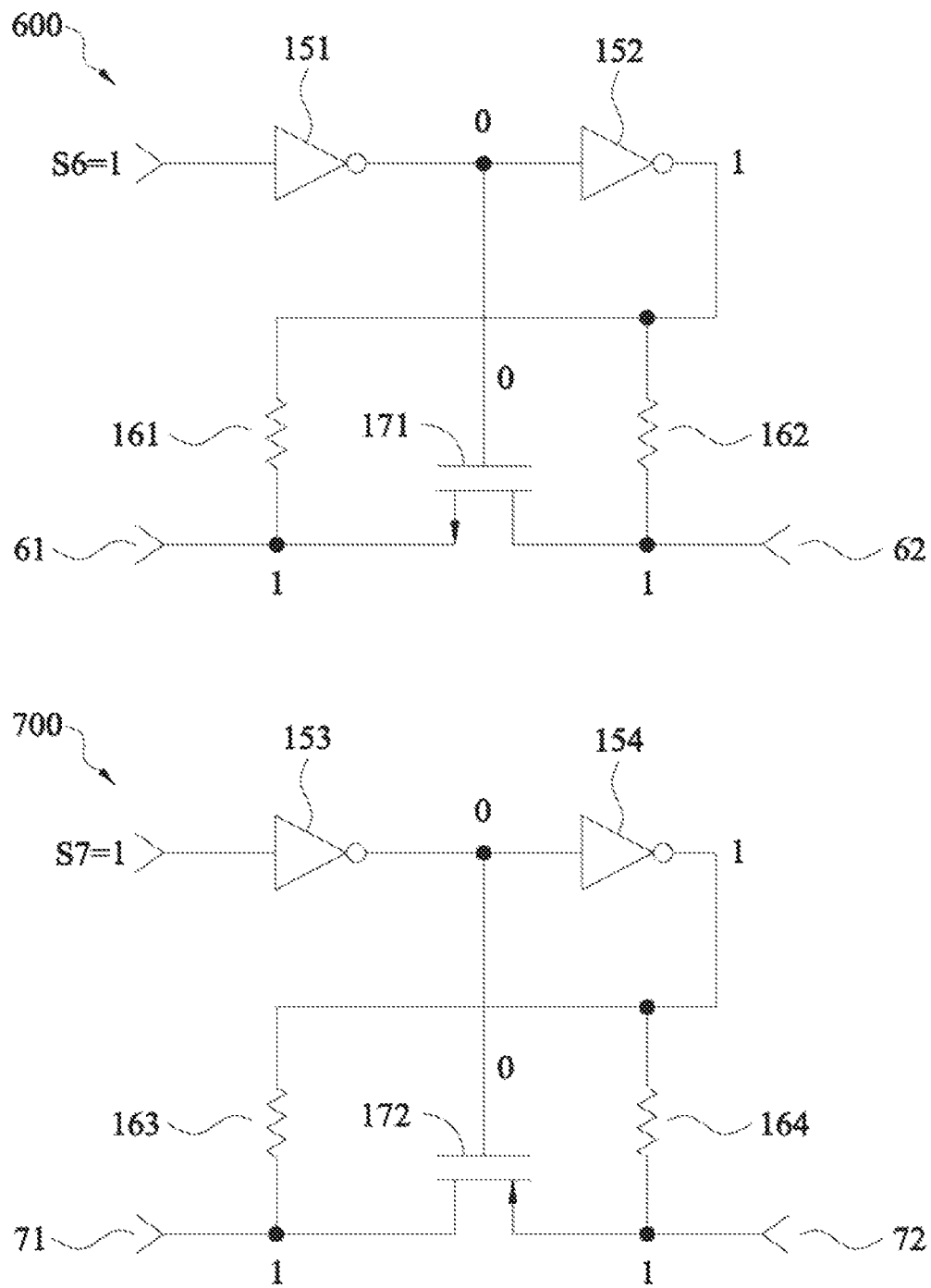

As shown in FIG. 9, the switch control signals S6, S7 have the logical polarity 1 (e.g., high voltage). As a result, the gate electrode of the transistor 171 has the logical polarity 0 (e.g., low voltage), and the source and drain electrodes of the transistor 171 have the logical polarity 1 (e.g., high voltage). Negative gate-source voltage ($V_{GS}$) of the transistor 171 turns off the transistor 171, electrically isolating the node 61 from the node 62 of the switch circuit 600. In the switch circuit 700, the gate electrode of the transistor 172 has the logical polarity 0 (e.g., low voltage) when the switch control signal S7 has the logical polarity 1 (e.g., high voltage). The source and drain electrodes of the transistor 172 have the logical polarity 1 (e.g., high voltage). Positive source-gate voltage ($V_{SG}$) of the transistor 172 turns off the transistor 172, electrically connecting the node 71 to the node 72 of the switch circuit 700.

Figure 10:
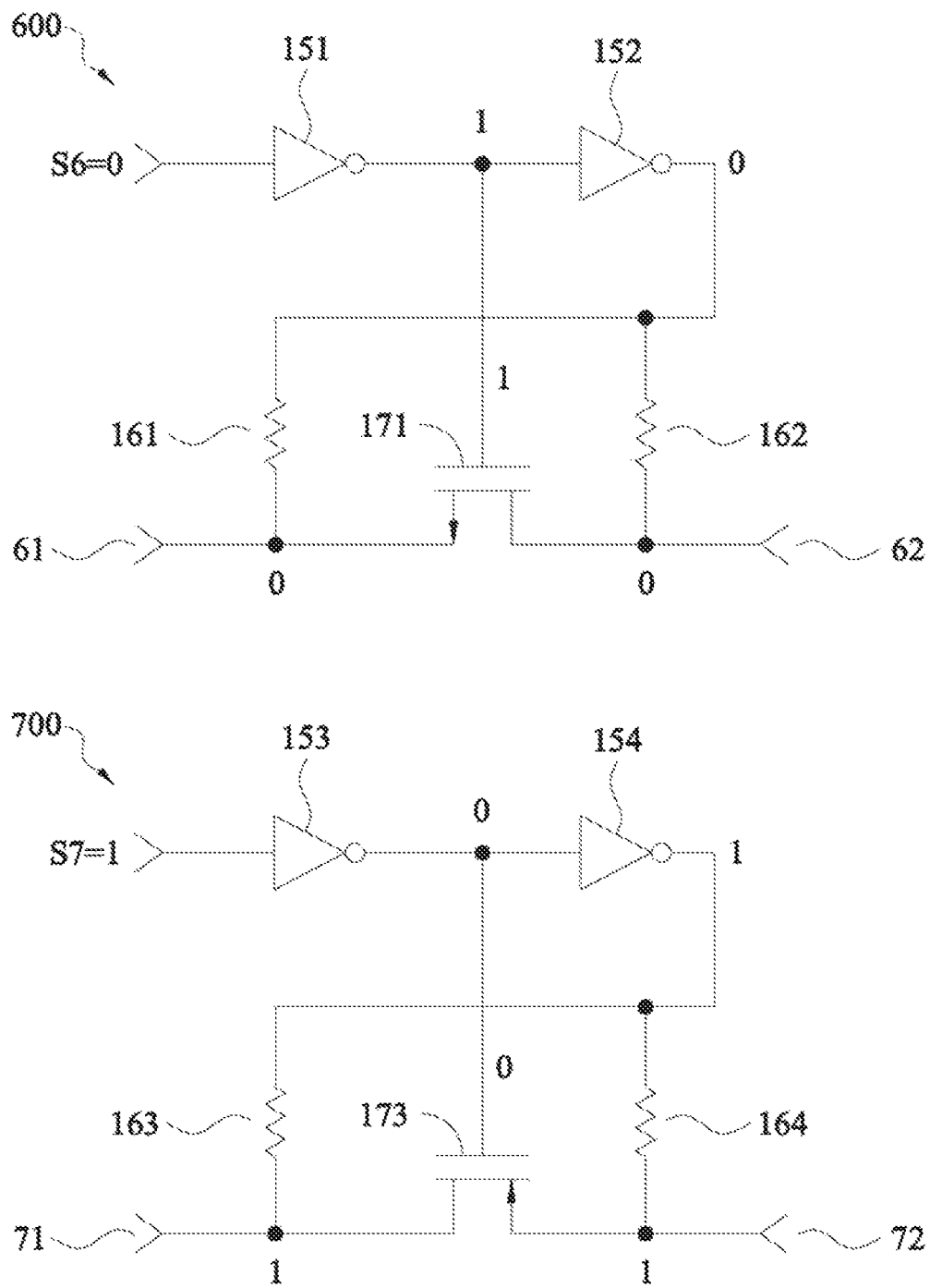
Figure 11:
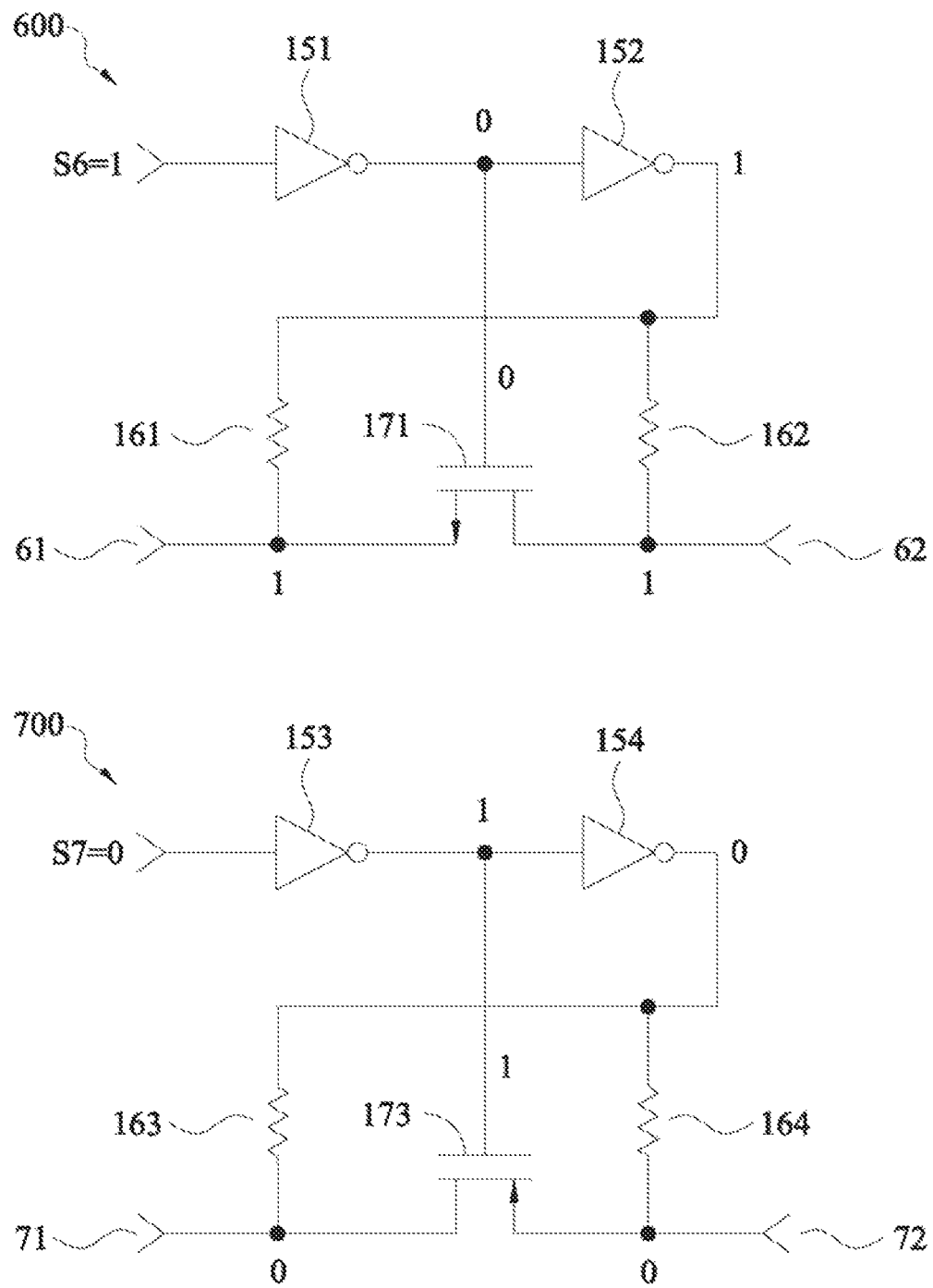

In FIGS. 10 and 11, an NMOS transistor 173 is used in the switch circuit 700 instead of the transistor 172 (PMOS) shown in FIG. 7. A gate electrode of the NMOS transistor 173 is electrically connected to the output terminal of the first inverter 153. A source electrode of the NMOS transistor 173 is electrically connected to the node 71, and a drain electrode of the NMOS transistor 173 is electrically connected to the node 72. In some embodiments, the transistors 171 and 173 are PMOS transistors. The transistors 171, 173 are of the same doping polarity (N-type, P-type). The transistors 171, 172 are of different doping polarities.

In FIG. 10, the switch control signal S7 has the logical polarity 1 (e.g., high voltage) when the switch control signal S6 has the logical polarity 0 (e.g., low voltage). As a result, the gate electrode of the transistor 171 has the logical polarity 1 (e.g., high voltage) due to inverting action of the first inverter 151, and the source and drain electrodes of the transistor 171 have the logical polarity 0 (e.g., low voltage) due to the inverting action of the second inverter 152. The transistor 171 is turned on due to positive gate-source voltage ($V_{GS}$) of the transistor 171, which electrically connects the node 61 to the node 62 in the switch circuit 600. The switch control signal S7 has the logical polarity 1 (e.g., high voltage). As a result, the gate electrode of the NMOS transistor 173 has the logical polarity 0 (e.g., low voltage) due to inverting action of the first inverter 153, and the source and drain electrodes of the NMOS transistor 173 have the logical polarity 1 (e.g., high voltage) due to the inverting action of the second inverter 154. The NMOS transistor 173 is turned off due to negative gate-source voltage ($V_{GS}$) of the NMOS transistor 173, which electrically isolates the node 71 from the node 72 in the switch circuit 700.

In FIG. 11, the switch control signal S7 has the logical polarity 0 (e.g., low voltage) when the switch control signal S6 has the logical polarity 1 (e.g., high voltage). As a result, the gate electrode of the transistor 171 has the logical polarity 0 (e.g., low voltage) due to inverting action of the first inverter 151, and the source and drain electrodes of the transistor 171 have the logical polarity 1 (e.g., high voltage) due to the inverting action of the second inverter 152. The transistor 171 is turned off due to negative gate-source voltage ($V_{GS}$) of the transistor 171, which electrically isolates the node 61 from the node 62 in the switch circuit 600. The switch control signal S7 has the logical polarity 0 (e.g., low voltage). As a result, the gate electrode of the NMOS transistor 173 has the logical polarity 1 (e.g., high voltage) due to inverting action of the first inverter 153, and the source and drain electrodes of the NMOS transistor 173 have the logical polarity 0 (e.g., low voltage) due to the inverting action of the second inverter 154. The NMOS transistor 173 is turned on due to positive gate-source voltage ($V_{GS}$) of the NMOS transistor 173, which electrically connects the node 71 to the node 72 in the switch circuit 700.

Figure 12:
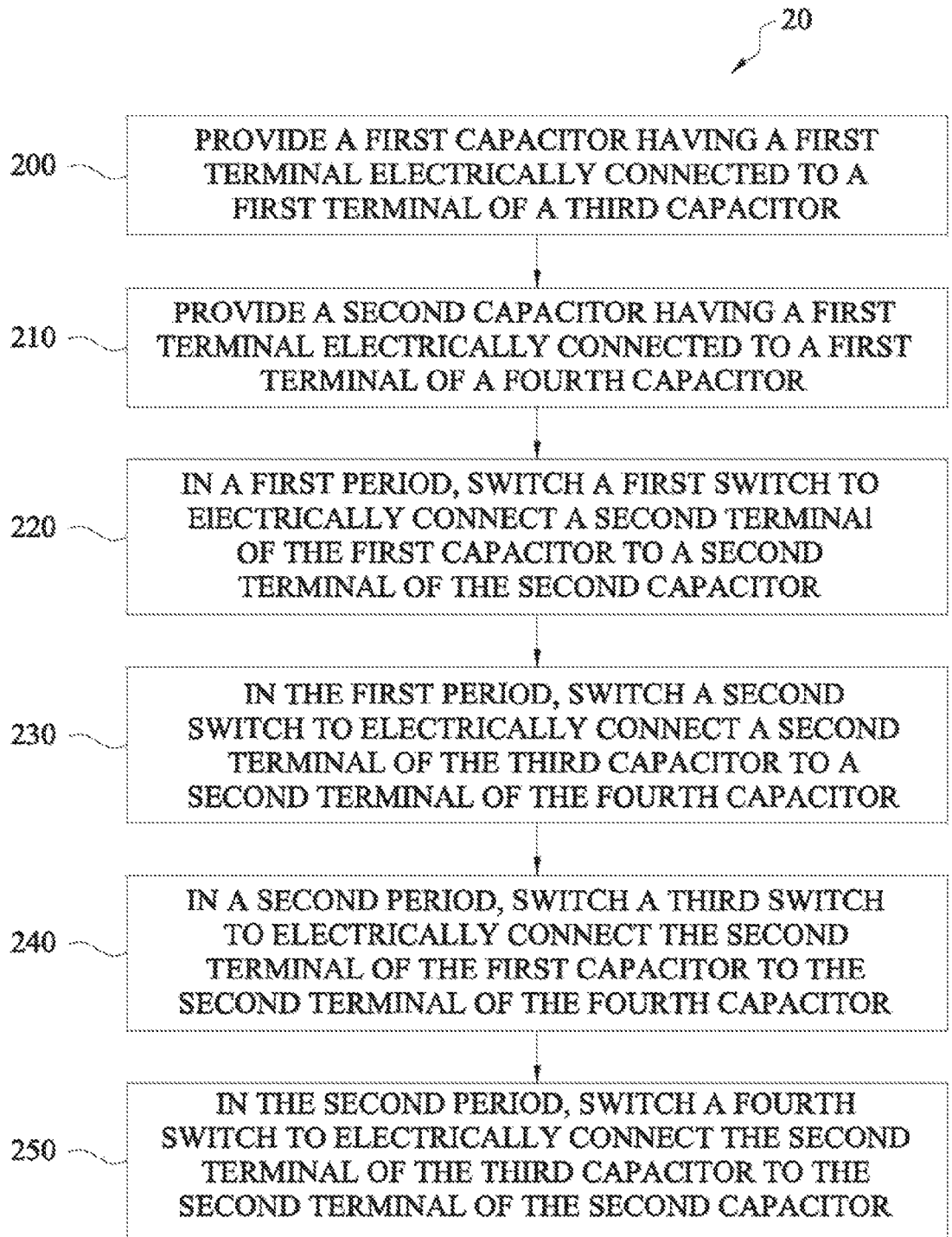
FIG. 12 is a flowchart of a method of operating an electronic device with switched-capacitor tuning in accordance with various embodiments of the present disclosure.

FIG. 12 is a flowchart of a method 20 of operating an electronic device with switched-capacitor tuning in accordance with various embodiments of the present disclosure. In some embodiments, the method 20 operates the electronic device 10. The following description of the method 20 is made with reference to the electronic device 10 and the FIGS. 1-11 described above. In block 200, a first capacitor, such as the first capacitor 121, is provided. The first capacitor has a first terminal electrically connected to a first terminal of a third capacitor, such as the third capacitor 123. In block 210, a second capacitor, such as the second capacitor 122, is provided. The second capacitor has a first terminal electrically connected to a first terminal of a fourth capacitor, such as the fourth capacitor 124.

In block 220, a first switch, such as the first switch 131, is turned on in a first period to electrically connect a second terminal of the first capacitor to a second terminal of the second capacitor. In block 230, a second switch, such as the second switch 132, is turned on in the first period to electrically connect a second terminal of the third capacitor to a second terminal of the fourth capacitor. In some embodiments, completion of the blocks 220 and 230 results in the variable capacitor 311 configuration shown in FIG. 4. In some embodiments, the blocks 220 and 230 are performed simultaneously.

In block 240, a third switch, such as the third switch 141, is turned on in a second period to electrically connect the second terminal of the first capacitor to the second terminal of the fourth capacitor. In block 250, a fourth switch, such as the fourth switch 142, is turned on in the second period to electrically connect the second terminal of the third capacitor to the second terminal of the second capacitor. In some embodiments, completion of the blocks 240 and 250 results in the variable capacitor 311 configuration shown in FIG. 6. In some embodiments, the blocks 240 and 250 are performed simultaneously. In some embodiments, the blocks 220 and 230 are performed by the switch circuit 600 shown in FIG. 6, and the block 230 is performed by the switch circuit 700 shown in FIG. 7. In some embodiments, the blocks 240 and 250 are performed by the switch circuit 700 shown in FIG. 7.

In some embodiments, the block 220 further includes turning off the third switch to electrically isolate the second terminal of the first capacitor from the second terminal of the fourth capacitor. In some embodiments, the block 230 further includes turning off the fourth switch to electrically isolate the second terminal of the third capacitor from the second terminal of the second capacitor.

In some embodiments, the block 240 further includes turning off the first switch to electrically isolate the second terminal of the first capacitor from the second terminal of the second capacitor. In some embodiments, the block 250 further includes turning off the second switch to electrically isolate the second terminal of the third capacitor from the second terminal of the fourth capacitor.

Figure 13:
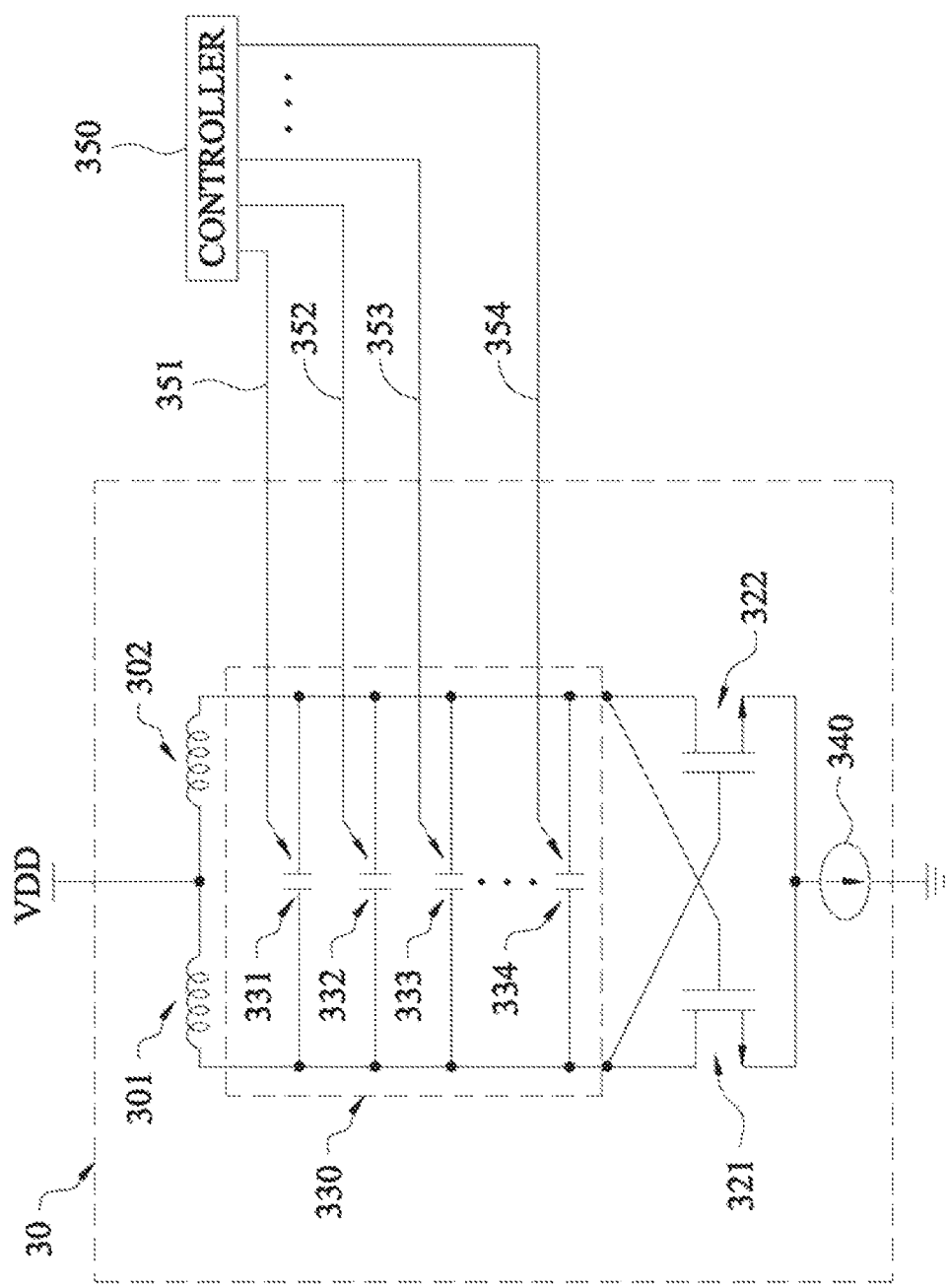
FIG. 13 is a circuit diagram of a digitally-controlled oscillator (DCO) in accordance with various embodiments of the present disclosure.

FIG. 13 is a circuit diagram of a digitally-controlled oscillator (DCO) 30 in accordance with various embodiments of the present disclosure. The DCO 30 is operable over a range of frequencies from a minimum frequency $f_{min}$ to a maximum frequency $f_{max}$. Transistors 321, 322 of the DCO 30 are biased by a current source 340, and electrically connected to a resonant load including a capacitor bank 330 and inductors 301, 302 tied to a voltage supply node VDD. In some embodiments, the transistors 321, 322 are NMOS transistors.

A finite number of intermediate frequencies between the minimum frequency $f_{min}$ and the maximum frequency $f_{max}$ are selectable through digital control of the capacitor bank 330 by a controller 350. The capacitor bank 330 has variable capacitance controllable by control signals 351, 352, 353, . . . , 354 of the controller 350. In some embodiments, when the control signals 351, 352, 353, . . . , 354 outputted by the controller 350 to the capacitor bank 330 all have a first logical polarity (e.g., logic 0, logic low), operating frequency of the DCO 30 is the minimum frequency $f_{min}$. In some embodiments, when the control signals 351, 352, 353, . . . , 354 all have a second logic polarity (e.g., logic 1, logic high), the operating frequency of the DCO 30 is the maximum frequency $f_{max}$.

In some embodiments, each capacitor of capacitors 331, 332, 333, . . . , 334 is a variable capacitor similar to, or identical to, the variable capacitor 311. Each capacitor of the capacitors 331, 332, 333, . . . , 334 is associated with a first capacitance (e.g., $C_{0\_331}$, $C_{0\_332}$) and a second capacitance (e.g., $C_{1\_331}$, $C_{1\_332}$). Each capacitor of the capacitors 331, 332, 333, . . . , 334 is associated with a capacitance delta. For example, the capacitor 331 is associated with a capacitance delta equal to $C_{1\_331}$-$C_{0\_331}$. A unit capacitance delta may be defined as $\Delta C$. The capacitors 331, 332, 333, . . . , 334 of the capacitor bank 330 have the same or different capacitance values (or capacitance deltas). In some embodiments, a first group of the capacitors 331, 332, 333, . . . , 334 have binary-coded capacitance deltas (e.g., 16*$\Delta C$, 8*$\Delta C$, 4*$\Delta C$), and a second group of the capacitors 331, 332, 333, . . . , 334 have thermometer-coded capacitance deltas (e.g., $\Delta C$, $\Delta C$, $\Delta C$).

The capacitor bank 330 and inductors 301, 302 form a resonator whose oscillation frequency is given by:

$$\omega_{osc} = \frac{1}{\sqrt{L \cdot (C_{min} + n \cdot \Delta C)}} \quad (5)$$

where L is the sum of the inductances of the inductors 301 and 302, $C_{min}$ is minimum (baseline) capacitance of the capacitor bank 330 (e.g., $C_{0\_331} + C_{0\_332} + \ldots + C_{0\_334}$), $\Delta C$ is the unit capacitance delta, and n is a number from 0 to N, where N is number of the capacitors 331, 332, 333, ..., 334 in the capacitor bank 330. A maximum capacitance $C_{max}$ of the capacitor bank 330 is, then, equal to $C_{min} + N^* \Delta C$.

In some embodiments, the controller 350 dynamically controls the capacitance of the capacitor bank 330. In some embodiments, the controller 350 receives an input signal from an external circuit, and varies the capacitance of the capacitor bank 330 based on the input signal. In some embodiments, the DCO 30 is in an all-digital phase-locked loop (ADPLL), and the controller 350 receives a phase or frequency error signal from a detector circuit of the ADPLL. The error signal indicates whether a clock signal outputted by the DCO 30 should be sped up (increase oscillation frequency) or slowed down (decrease oscillation frequency) to achieve a phase or frequency lock with an external clock signal. If the oscillation frequency of the DCO 30 is to be increased, the controller 350 adjusts the control signals 351, 352, 353, ..., 354 to decrease the capacitance of the capacitor bank 330. If the oscillation frequency of the DCO 30 is to be decreased, the controller 350 adjusts the control signals 351, 352, 353, ..., 354 to increase the capacitance of the capacitor bank 330.

In some embodiments, the controller 350 statically controls the capacitance of the capacitor bank 330. In some embodiments, the capacitor bank 330 and the controller 350 are applied to a tunable amplifier instead of to the DCO 30. In a functional test phase of development of an integrated circuit die including the tunable amplifier, a parameter of the tunable amplifier, such as gain, bandwidth, linearity or the like is characterized through test equipment. Based on the characterization, the controller 350 receives a programming signal for permanently setting logical polarities of the control signals 351, 352, 353, ..., 354. In some embodiments, a first terminal of the capacitor bank 330 (e.g., the node 31 of FIG. 3) is electrically connected to an input terminal of the tunable amplifier, and a second terminal of the capacitor bank 330 (e.g., the node 32 of FIG. 3) is electrically connected to an output terminal of the tunable amplifier. In some embodiments, the controller 350 includes a bank of fuses corresponding to the control signals 351, 352, 353, ..., 354. To set the logical polarities, the fuses are selectively blown or preserved to set the control signals 351, 352, 353, ..., 354 to have logic high or logic low polarities.

Figure 14:
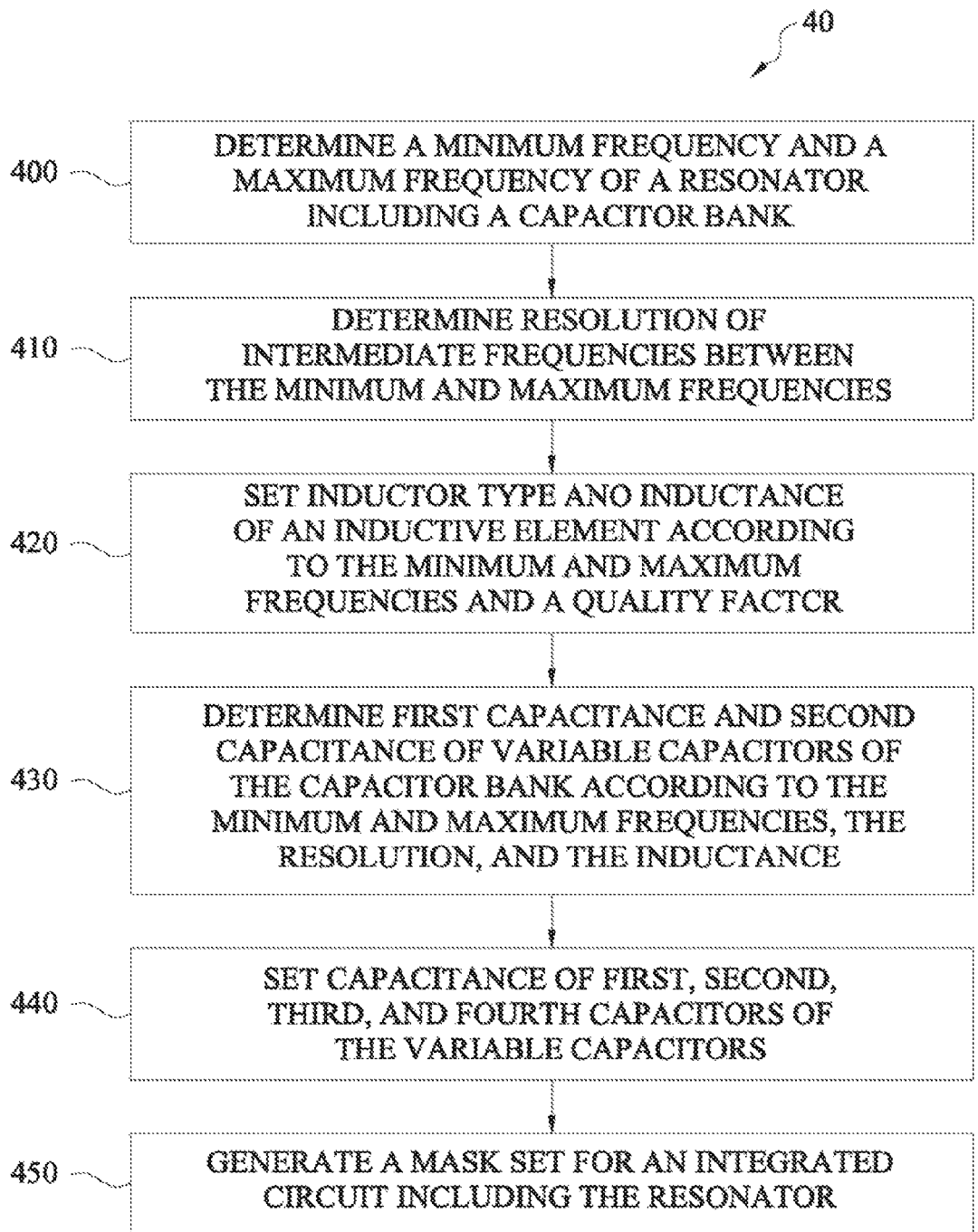
FIG. 14 is a flowchart of a method of designing an electronic device with switched-capacitor tuning in accordance with various embodiments of the present disclosure.

FIG. 14 is a flowchart of a method 40 of manufacturing an electronic device with switched-capacitor tuning in accordance with various embodiments of the present disclosure. In some embodiments, the method 40 manufactures an integrated circuit (IC) die including a digitally-controllable capacitor bank, such as the capacitor bank 330, and a controller, such as the controller 350. In some embodiments, the method 40 is performed partially or fully in an electronic design automation (EDA) environment run on a physical server. The physical server includes at least a processing unit and a memory unit. In block 400, a minimum frequency and a maximum frequency of a resonator including the capacitor bank are determined. In some embodiments, the minimum frequency and the maximum frequency are inputted to the physical server by a user through an input device, such as a mouse or a keyboard. In block 410, resolution of intermediate frequencies between the minimum and maximum frequencies is determined. In some embodiments, the resolution is a number of the intermediate frequencies. In some embodiments, the resolution is a frequency step or delta of the intermediate frequencies. In some embodiments, the user selects the number in a graphical user interface of the EDA environment, through a drop-down box, a radio button, or the like. In some embodiments, the frequency step is calculated by the server according to the number.

In block 420, an inductor type and an inductance of an inductive element (e.g., an inductor) are set according to the minimum and maximum frequencies and a quality factor (Q). In some embodiments, the inductor type is selected from a library of inductor models, and parameters of an inductor model are entered by the user to set the inductance and Q of an inductor. Examples of inductor types include planar spiral inductors, toroidal-meander type integrated (TMTI) inductors, solenoid-type integrated inductors (SI2's), or the like.

Variable capacitors of the capacitor bank, such as the variable capacitor 311, have two capacitances alternately selected through digital control (e.g., a 1-bit control signal). First and second capacitances (e.g., minimum and maximum capacitances) of the variable capacitors are determined in block 430 according to the minimum and maximum frequencies, the resolution, and the inductance of the inductive element. In some embodiments, the block 430 is performed automatically by the server. For example, when the user enters values for the minimum frequency, the maximum frequency, the number of intermediate frequencies, and the inductance of the inductive element, the server may calculate the first and second capacitances of the variable capacitors associated with the values entered. For example, a frequency range is calculated by taking the difference of the maximum frequency and the minimum frequency, and the frequency range is further divided into intermediate frequencies according to the resolution. In some embodiments, the user further specifies coding type of the variable capacitors. In some embodiments, the coding type is binary or thermometer. Based on the coding types, capacitance deltas associated with each of the variable capacitors are calculated.

In block 440, capacitances of first, second, third, and fourth capacitors (e.g., the first capacitor 121, the second capacitor 122, the third capacitor 123, and the fourth capacitor 124 of the variable capacitor 311) are set. In some embodiments, the capacitances are set according to the resolution set in the block 410. For example, an $i^{th}$ variable capacitor of the variable capacitors may be associated with a capacitive delta $\Delta C_i$ such that:

$$\Delta C_i = \frac{(C_B - C_A)^2}{2(C_A + C_B)} \quad (6)$$

which is similar to the formula (3) above. In some embodiments, the capacitance $C_A$ of the first and second capacitors is set to a capacitance of an integrated capacitor having minimum feature size in a semiconductor process node (e.g., 65 nanometers, 40 nanometers, 28 nanometers, or the like).

In block 450, the capacitances of the first, second, third, and fourth capacitors of the variable capacitors of the capacitor block have been set, and the inductance of the inductive element has been set. Using layout tools, a circuit layout including the resonator having the capacitor block and the inductive element is generated. After the blocks 400-440 are completed, the method provides for producing a non-transitory computer readable storage media with instructions for building a mask set for the IC die based on the circuit layout containing the resonator including the capacitor block and the inductive element.

Embodiments may achieve advantages. The capacitor block 330 using the variable capacitor 311 is able to achieve high frequency resolution with little to no area penalty through use of the switched-capacitor network shown in FIG. 3.

Figure 15:
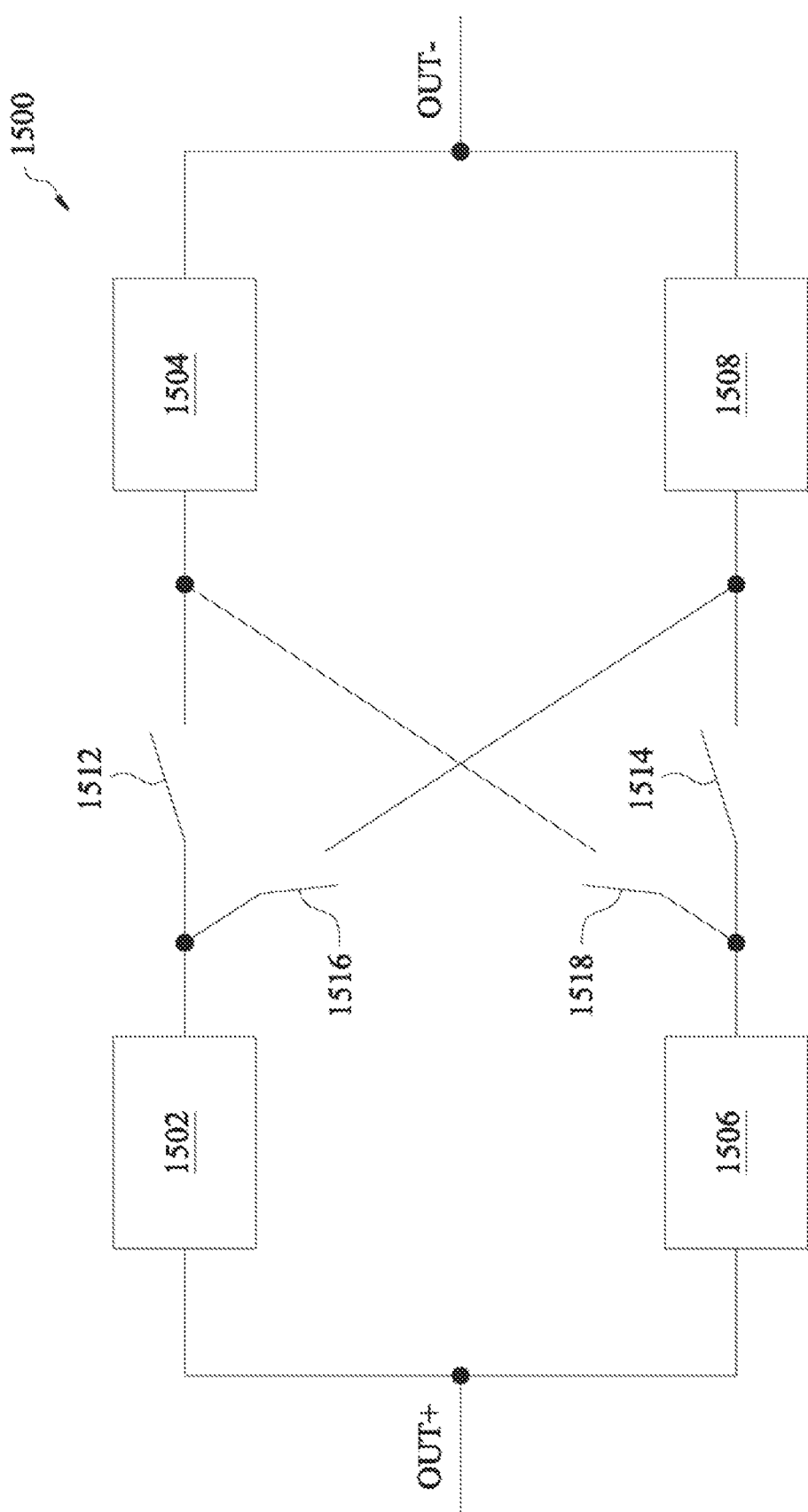
FIG. 15 illustrates a diagram of a variable capacitor in accordance with various embodiments of the present disclosure.

FIG. 15 illustrates a diagram of a variable capacitor in accordance with various embodiments of the present disclosure. The variable capacitor 1500 is between a first node OUT+ and a second node OUT− as shown in FIG. 15. The variable capacitor 1500 comprises four variable capacitance blocks, namely a first variable capacitance block 1502, a second variable capacitance block 1504, a third variable capacitance block 1506 and a fourth variable capacitance block 1508. The variable capacitor 1500 further comprises four switches 1512, 1514, 1516 and 1518.

As shown in FIG. 15, the switch 1512 is coupled between the first variable capacitance block 1502 and the second variable capacitance block 1504. The switch 1514 is coupled between the third variable capacitance block 1506 and the fourth variable capacitance block 1508. The switch 1516 is coupled between the first variable capacitance block 1502 and the fourth variable capacitance block 1508. The switch 1518 is coupled between the third variable capacitance block 1506 and the second variable capacitance block 1504.

In some embodiments, when switches 1512 and 1514 are turned on (or simultaneously turned on), and switches 1516 and 1518 are turned off (or simultaneously turned off), the first variable capacitance block 1502 and the second variable capacitance block 1504 are connected in series through the turned-on switch 1512. The series-connected variable capacitance blocks 1502 and 1504 form a first capacitor (a first capacitor branch). Likewise, the third variable capacitance block 1506 and the fourth variable capacitance block 1508 are connected in series through the turned-on switch 1514. The series-connected variable capacitance blocks 1506 and 1508 form a second capacitor (a second capacitor branch). The first capacitor and the second capacitor are connected in parallel to form a first equivalent capacitor of the variable capacitor 1500.

On the other hand, when switches 1512 and 1514 are turned off (or simultaneously turned off), and switches 1516 and 1518 are turned on (or simultaneously turned on), the first variable capacitance block 1502 and the fourth variable capacitance block 1508 are connected in series through the turned-on switch 1516. The series-connected variable capacitance blocks 1502 and 1508 form a third capacitor (a third capacitor branch) Likewise, the third variable capacitance block 1506 and the second variable capacitance block 1504 are connected in series through the turned-on switch 1518. The series-connected variable capacitance blocks 1504 and 1506 form a fourth capacitor (a fourth capacitor branch). The third capacitor and the fourth capacitor are connected in parallel to form a second equivalent capacitor of the variable capacitor 1500. By controlling the on-off of the switches of FIG. 15, the variable capacitor 1500 may have at least two different capacitances. The operation principle of the variable capacitor 1500 will be described in detail with respect to FIGS. 17 and 18.

In some embodiments, switches (e.g., switch 1512) shown in FIG. 15 may be implemented as N-type metal-oxide semiconductor (NMOS) transistors, P-type metal-oxide-semiconductor (PMOS) transistors, pass gates, any combinations thereof and/or the like.

In some embodiments, each variable capacitance block (e.g., the first variable capacitance block 1502) shown in FIG. 15 may be implemented as a combination of a plurality of capacitors. For example, the variable capacitance block may be implemented as suitable capacitance structures such as the capacitance structures shown in FIG. 4 and FIG. 5.

In some embodiments, the first variable capacitance block 1502 may comprise a plurality of first capacitors. The first capacitors are arranged in a first configuration. The second variable capacitance block 1504 may comprise a plurality of second capacitors. The second capacitors are arranged in the first configuration. In some embodiments, the first configuration is the capacitor configuration shown in FIG. 4. In alternative embodiments, the first configuration is the capacitor configuration shown in FIG. 5.

In some embodiments, the third variable capacitance block 1506 may comprise a plurality of third capacitors. The third capacitors are arranged in a second configuration. The fourth variable capacitance block 1508 may comprise a plurality of fourth capacitors. The fourth capacitors are arranged in the second configuration. In some embodiments, the second configuration is the capacitor configuration shown in FIG. 4. In alternative embodiments, the second configuration is the capacitor configuration shown in FIG. 5.

In some embodiments, each capacitor (not shown) of the variable capacitance blocks (e.g., the first variable capacitance block 1502) may be an integrated capacitor, such as metal-oxide-metal (MOM) capacitors, metal-insulator-metal (MIM) capacitors, polysilicon capacitors, any combinations thereof and/or the like.

It should be noted that the variable capacitor 1500 can be used in the digitally-controlled oscillator shown in FIG. 13. In other words, the capacitors 331, 332, 333, . . . , 334 shown in FIG. 13 may be a variable capacitor similar to, or identical to, the variable capacitor 1500 shown in FIG. 15. The operation principles of the digitally-controlled oscillator has been described above with respect to FIG. 13, and hence are not discussed again to avoid unnecessary repetition. Furthermore, the flowcharts shown in FIG. 12 and FIG. 14 are applicable to the variable capacitor shown in FIG. 15.

It should further be noted that switches 1512, 1514, 1516 and 1518 shown in FIG. 15 are similar to those shown in FIG. 3. The detailed structures and operation principles of these switches have been described above with respect to FIGS. 6-11, and hence are not discussed again for simplicity.

Figure 16:
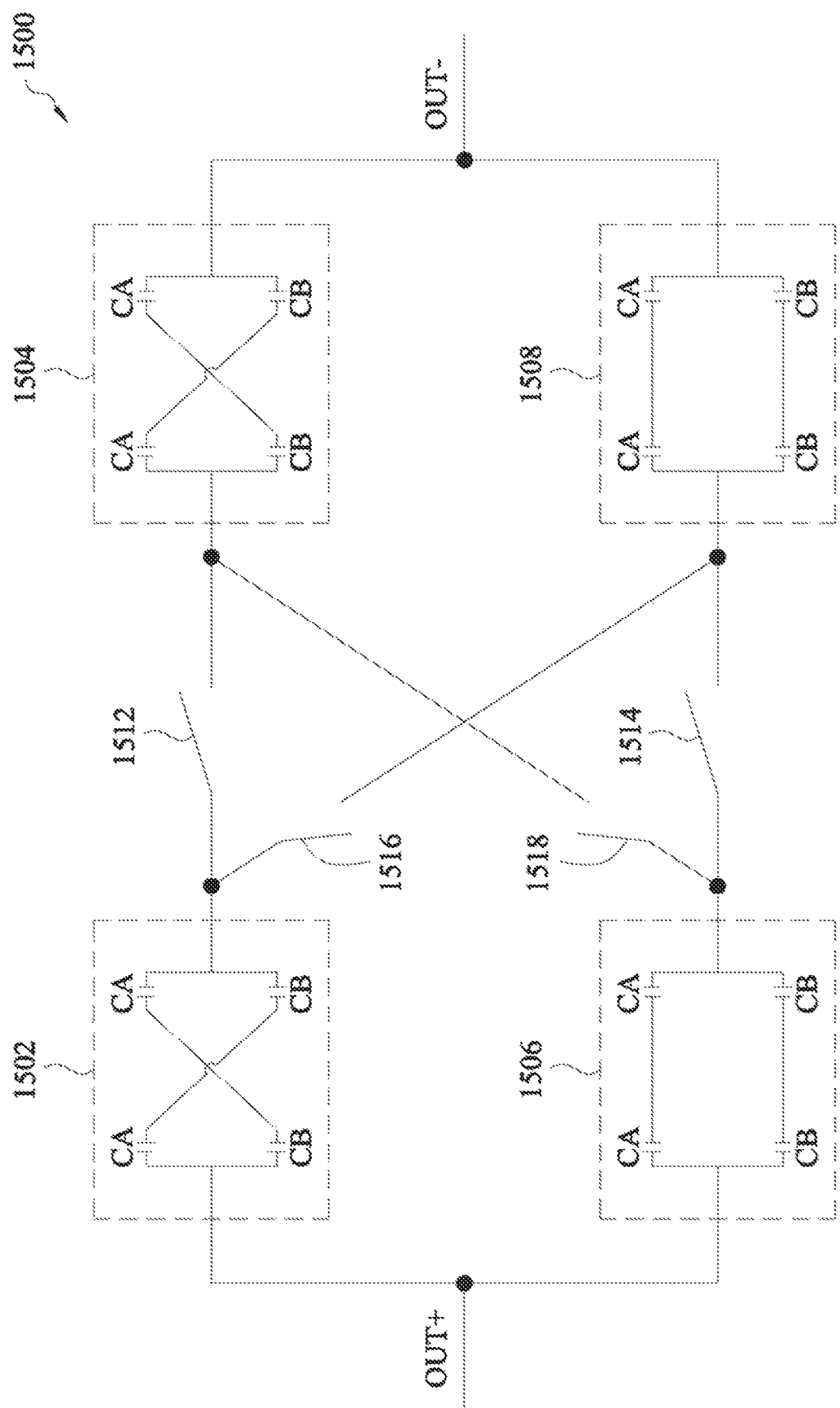
FIG. 16 illustrates a schematic diagram of the variable capacitor shown in FIG. 15 in accordance with various embodiments of the present application.

FIG. 16 illustrates a schematic diagram of the variable capacitor shown in FIG. 15 in accordance with various embodiments of the present application. The first variable capacitance block 1502 comprises four capacitors. The capacitor configuration of the first variable capacitance block 1502 is similar to that shown in FIG. 5.

As shown in FIG. 16, a first capacitance of the first capacitor is equal to a second capacitance of the second capacitor. Both the first capacitance and the second capacitance are equal to $C_A$. A third capacitance of the third capacitor is equal to a fourth capacitance of the fourth capacitor. Both the third capacitance and the fourth capacitance are equal to $C_B$.

The first capacitor and the fourth capacitor are connected in series between a first terminal and a second terminal of the first variable capacitance block 1502. The second capacitor and the third capacitor are connected in series between the first terminal and the second terminal of the first variable capacitance block 1502. The equivalent capacitance of the first variable capacitance block 1502 is given by the following equation:

$$C_{1502} = \frac{2C_A C_B}{C_A + C_B} \tag{7}$$

Assuming $C_A$ and $C_B$ satisfy the following equation:

$$C_B = (1+\Delta) \cdot C_A \tag{8}$$

where $\Delta$ is approximately equal to 0.1 in some embodiments.

After substituting $C_B$ of Equation (7) with $C_B$ of Equation (8), Equation (7) may be expressed as the following equation:

$$C_{1502} = C_A \frac{2+2\Delta}{2+\Delta} \tag{9}$$

The second variable capacitance block 1504 comprises four capacitors. The capacitor configuration of the second variable capacitance block 1504 is similar to that of the first variable capacitance block 1502, and hence is not described in further detail to avoid unnecessary repetition. The equivalent capacitance of the second variable capacitance block 1504 is given by the following formula:

$$C_{1504} = \frac{2C_A C_B}{C_A + C_B} \tag{10}$$

It should be noted that the capacitance of $C_{1504}$ is equal to the capacitance of $C_{1502}$. Throughout the description, the capacitance of $C_{1502}$ and $C_{1504}$ is alternatively referred to as $C_X$ for simplicity. According to Equation (9), $C_X$ can be given by the following equation:

$$C_X = C_A \frac{2+2\Delta}{2+\Delta} \tag{11}$$

The third variable capacitance block 1506 comprises four capacitors. The capacitor configuration of the third variable capacitance block 1506 is similar to that shown in FIG. 4, and hence is not described in further detail to avoid unnecessary repetition. The equivalent capacitance of the third variable capacitance block 1506 is given by the following equation:

$$C_{1506} = \frac{C_A}{2} + \frac{C_B}{2} \tag{12}$$

After substituting $C_B$ of Equation (12) with $C_B$ of Equation (8), Equation (12) may be expressed as the following equation:

$$C_{1506} = C_A \frac{2+\Delta}{2} \tag{13}$$

The fourth variable capacitance block 1508 comprises four capacitors. The capacitor configuration of the fourth variable capacitance block 1508 is similar to that of the third variable capacitance block 1506, and hence is not described in further detail to avoid unnecessary repetition. The equivalent capacitance of the fourth variable capacitance block 1508 is given by the following equation:

$$C_{1508} = \frac{C_A}{2} + \frac{C_B}{2} \tag{14}$$

It should be noted that the capacitance of $C_{1506}$ is equal to the capacitance of $C_{1508}$. Throughout the description, the capacitance of $C_{1506}$ and $C_{1508}$ is alternatively referred to as $C_\parallel$ for simplicity. According to Equation (13), $C_\parallel$ is given by the following equation:

$$C_\parallel = C_A \frac{2+\Delta}{2} \tag{15}$$

Assuming $C_\parallel$ and $C_X$ satisfy the following equation:

$$C_X = (1+\delta) \cdot C_\parallel \tag{16}$$

According to Equations (11) and (15), Equation (16) may be expressed as:

$$\delta = \frac{C_X}{C_\parallel} - 1 = \frac{C_A \frac{2+2\Delta}{2+\Delta}}{C_A \frac{2+\Delta}{2}} - 1 \tag{17}$$

From Equation (17), $\delta$ can be rewritten as:

$$\delta = \frac{-\Delta^2}{4+4\Delta+\Delta^2} \tag{18}$$

Since $\Delta$ is approximately equal to 0.1, after ignoring high order terms, Equation (18) can be simplified as:

$$\delta = \frac{\Delta^2}{4} \tag{19}$$

Figure 17:
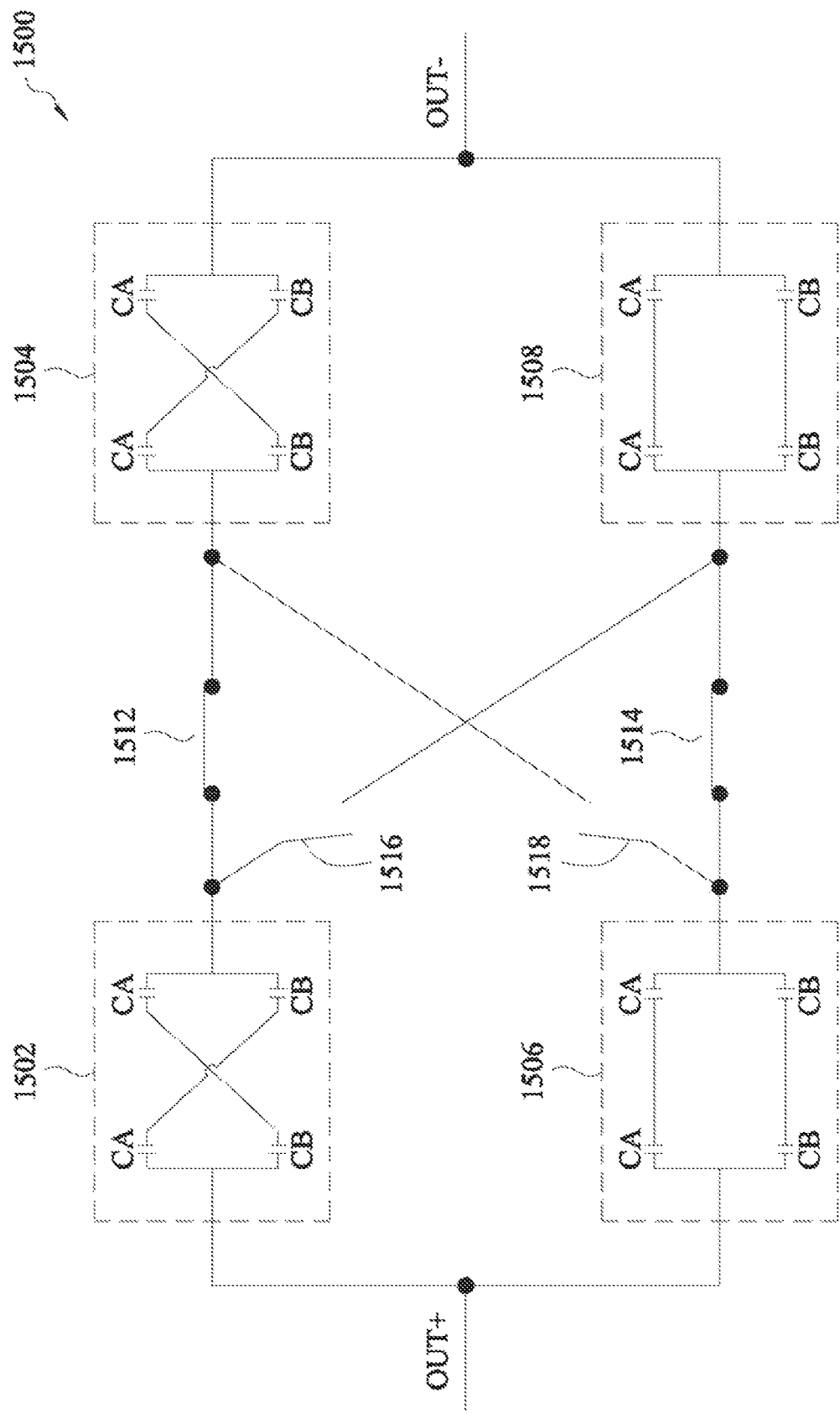
FIG. 17 illustrates a schematic diagram of the variable capacitor having the first capacitor in accordance with various embodiments of the present disclosure.

FIG. 17 illustrates a schematic diagram of the variable capacitor having the first capacitor in accordance with various embodiments of the present disclosure. As shown in FIG. 17, the switches 1512 and 1514 are turned on, and the switches 1516 and 1518 are turned off. The turned-on switch 1512 connects the first variable capacitance block 1502 and the second variable capacitance block 1504 in series to form a first capacitor branch. Likewise, the turned-on switch 1514 connects the third variable capacitance block 1506 and the fourth variable capacitance block 1508 in series to form a second capacitor branch. The first capacitor branch and the second capacitor branch are connected in parallel to form the first capacitor. The capacitance of the first capacitor can be defined as $C_{parallel}$. $C_{parallel}$ is given by the following equation:

$$C_{parallel} = \frac{C_\parallel}{2} + \frac{C_X}{2} \tag{20}$$

After substituting Equation (16) into Equation (20), Equation (20) can be expressed as the following equation:

$$C_{parallel} = C_{//} \cdot \frac{2+\delta}{2} \quad (21)$$

Figure 18:
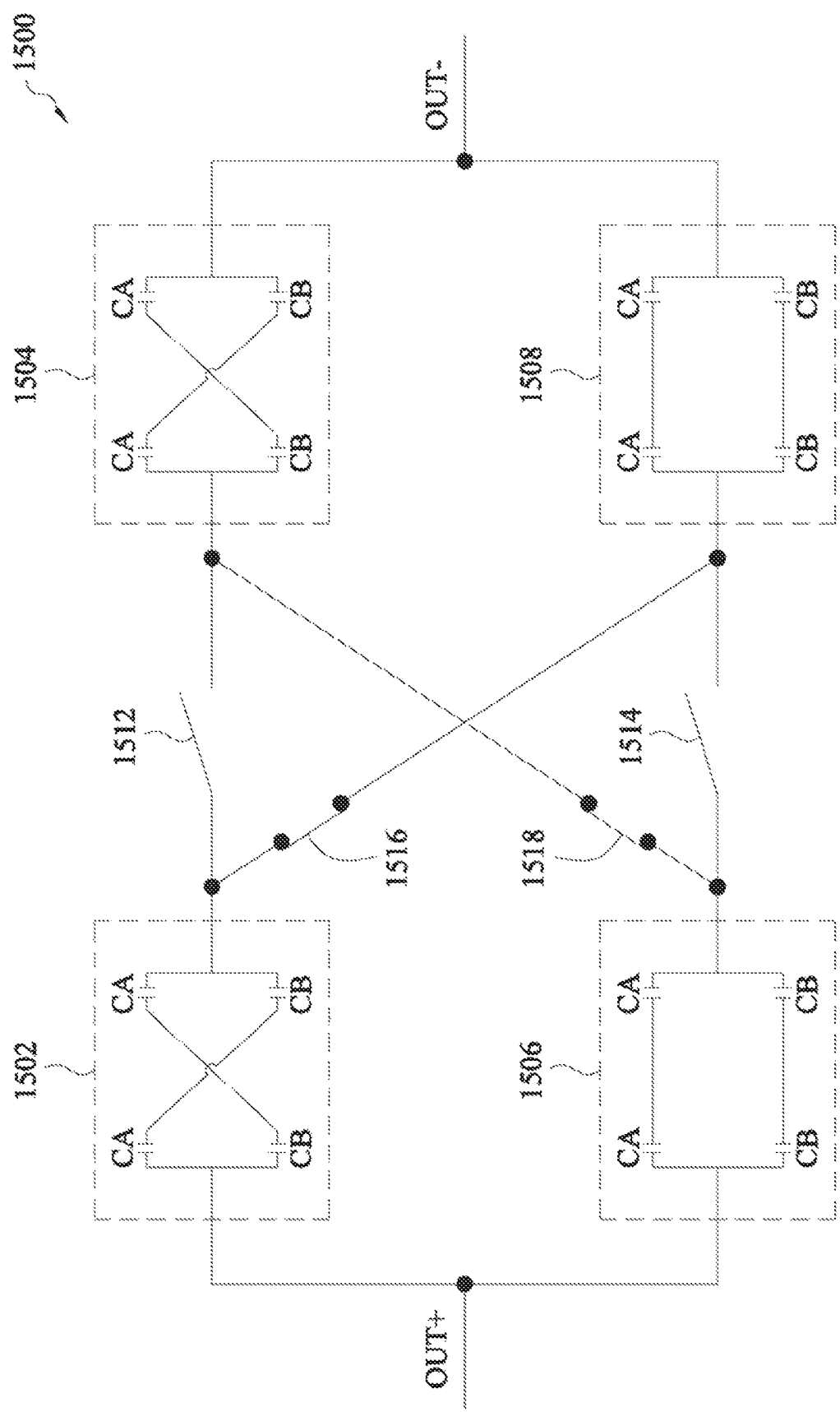
FIG. 18 illustrates a schematic diagram of the variable capacitor having the second capacitor in accordance with various embodiments of the present disclosure.

FIG. 18 illustrates a schematic diagram of the variable capacitor having the second capacitor in accordance with various embodiments of the present disclosure. As shown in FIG. 18, the switches 1516 and 1518 are turned on, and the switches 1512 and 1514 are turned off. The turned-on switch 1516 connects the first variable capacitance block 1502 and the fourth variable capacitance block 1508 in series to form a third capacitor branch. Likewise, the turned-on switch 1518 connects the third variable capacitance block 1506 and the second variable capacitance block 1504 in series to form a fourth capacitor branch. The third capacitor branch and the fourth capacitor branch are connected in parallel to form the second capacitor. The capacitance of the second capacitor can be defined as $C_{cross}$. $C_{cross}$ is given by the following equation:

$$C_{cross} = \frac{2 \cdot C_{//} \cdot C_X}{C_{//} + C_X} \quad (22)$$

After substituting Equation (16) into Equation (22), Equation (22) can be expressed as the following equation:

$$C_{cross} = C_{//} \cdot \frac{2+2\delta}{2+\delta} \quad (23)$$

In consideration with Equation (21) and Equation (23), the capacitance delta of the variable capacitor 1500 is given by the following equation:

$$\Delta C = C_{parallel} - C_{cross} = C_{//} \cdot \left( \frac{2+\delta}{2} - \frac{2+2\delta}{2+\delta} \right) \quad (24)$$

Based upon Equation (24), the capacitance delta of the variable capacitor 1500 can be simplified as:

$$\Delta C = C_{//} \cdot \frac{\delta^2}{4+4\delta} \quad (25)$$

Equation (25) can be approximated as:

$$\frac{\Delta C}{C_{//}} = \frac{\delta^2}{4} = \frac{\Delta^2}{64} \quad (26)$$

As described above, $\Delta$ is approximately equal to 0.1. Equation (26) gives the ratio of the capacitance delta to C|| is approximately equal to $1.56 \cdot 10^{-6}$. One advantageous feature having the variable capacitor shown in FIGS. 15-18 is the variable capacitor 1500 can achieve a high resolution variable capacitance. In some embodiments, the capacitance variation from a semiconductor process is about 0.1 fF. Based upon such a capacitance variation (e.g., 0.1 fF), an oscillator (e.g., the oscillator shown in FIG. 13) may be capable of delivering an output resolution of about 13 bits. The variable capacitor shown in FIG. 3 may improve the output resolution by reducing the capacitance variation to a level approximately equal to 0.001 fF. Such a reduced capacitance variation helps the oscillator shown in FIG. 13 achieve an output resolution of about 19 bits.

The variable capacitor 1500 further reduces the capacitance variation as shown in Equation (26). The variable capacitor 1500 can improve the output resolution of the oscillator shown in FIG. 13 by 4 or 5 bits. As a result, an oscillator (e.g., the oscillator shown in FIG. 13) comprising variable capacitors 1500 can achieve an output resolution of about 24 bits. Such a resolution satisfies the frequency resolution requirements of 4G and/or 5G wireless communication systems.

Circuits are typically powered and/or biased by multiple voltages. The multiple voltages set up potential differences that allow electrical currents to flow throughout the circuit to perform various functions. Typically, electrical currents are defined as flowing from high voltage to low voltage. Voltage sources in circuits are also often defined in terms of a supply voltage and ground, with ground representing 0 Volts. Other definitions are sometimes given in terms of an upper supply voltage (VDD, VCC), and a lower supply voltage (VSS, VEE). Thus, a circuit that operates on a 1.8 Volt supply may be defined as having an upper bias of 0.9 Volts, and a lower bias of −0.9 Volts. In the following description, the term "ground" should be interpreted as including low supply voltage, such as the −0.9 Volts in the previous example, unless specifically referred to as "earth ground," or the like. Voltage levels, being relative, are not then intended so much to limit the scope of the disclosure, but more as a point of reference for convenient illustration.

Metal-oxide-semiconductor (MOS) transistors are typically described in terms of four transistor terminals: a gate, a source, a drain, and a bulk. It should be appreciated that most MOS transistors are symmetrical devices, such that the source and the drain thereof are interchangeable, and the terms "source" and "drain" often represent nomenclature for convenience of discussion. Terminals of MOS transistors may also be referred to as "electrodes," "ends," and the like, without any distinction intended through use of these different names. Biasing of such terminals is usually performed through direct or indirect contact between a direct current (DC) voltage source and the terminal being biased. The contact may be through metallization layers, contact vias, pads, bumps, and/or similar interconnect structures formed on and over device regions of the MOS transistors.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

In accordance with an embodiment, a device comprises a first capacitor block comprising a plurality of first capacitors connected in a first configuration, a second capacitor block comprising a plurality of second capacitors connected in the first configuration, a third capacitor block comprising a plurality of third capacitors connected in a second configuration, a fourth capacitor block comprising a plurality of fourth capacitors connected in the second configuration, a first switch connected between the first capacitor block and the second capacitor block, a second switch connected between the third capacitor block and the fourth capacitor block, a third switch connected between the first capacitor block and the fourth capacitor block and a fourth switch connected between the third capacitor block and the second capacitor block.

In accordance with an embodiment, a device comprises a first block and a second block having a same capacitor configuration, wherein both the first block and the second block comprise two capacitor branches connected in parallel, a first switch connected between the first block and the second block, a third block and a fourth block having a same capacitor configuration, wherein both the third block and the fourth block comprise two capacitor branches connected in parallel, a second switch connected between the third block and the fourth block, a third switch connected between the first block and the fourth block and a fourth switch connected between the third block and the second block, wherein the first block, the second block, the third block, the fourth block and the switches form a variable capacitance block.

In accordance with an embodiment, a method comprises in response to a first operation mode, turning on a first switch and a second switch, and turning off a third switch and a fourth switch, wherein the first switch is connected between a first capacitor block and a second capacitor block, the second switch is connected between a third capacitor block and a fourth capacitor block, the third switch is connected between the first capacitor block and the fourth capacitor block, the fourth switch is connected between the second capacitor block and the third capacitor block, the first capacitor block and the second capacitor block share a first capacitor configuration and the third capacitor block and the fourth capacitor block share a second capacitor configuration and in response to a second operation mode, turning off the first switch and the second switch, and turning on the third switch and the fourth switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first capacitor block comprising a plurality of first capacitors connected in a first configuration;
   a second capacitor block comprising a plurality of second capacitors connected in the first configuration;
   a third capacitor block comprising a plurality of third capacitors connected in a second configuration;
   a fourth capacitor block comprising a plurality of fourth capacitors connected in the second configuration;
   a first switch connected between the first capacitor block and the second capacitor block;
   a second switch connected between the third capacitor block and the fourth capacitor block;
   a third switch connected between the first capacitor block and the fourth capacitor block; and
   a fourth switch connected between the third capacitor block and the second capacitor block.

2. The device of claim 1, wherein:
   the first capacitor block, the second capacitor block, the third capacitor block, the fourth capacitor block, the first switch, the second switch, the third switch and the fourth switch form a variable capacitance block.

3. The device of claim 2, further comprising:
   an inductive element, wherein the variable capacitance block is connected in parallel with the inductive element.

4. The device of claim 1, wherein:
   the first capacitor block comprises a first capacitor, a second capacitor, a third capacitor and a fourth capacitor, and wherein:
   a first capacitance of the first capacitor is equal to a second capacitance of the second capacitor;
   a third capacitance of the third capacitor is equal to a fourth capacitance of the fourth capacitor;
   the first capacitor and the fourth capacitor are connected in series to form a first capacitor branch; and
   the second capacitor and the third capacitor are connected in series to form a second capacitor branch, and wherein the first capacitor branch and the second capacitor branch are connected in parallel.

5. The device of claim 4, wherein:
   the second capacitor block and the first capacitor block share a same structure.

6. The device of claim 5, wherein:
   the first switch has a first terminal directly connected to a terminal of the first capacitor block and a second terminal directly connected to a terminal of the second capacitor block.

7. The device of claim 1, wherein:
   the third capacitor block comprises a fifth capacitor, a sixth capacitor, a seventh capacitor and an eighth capacitor, and wherein:
   a fifth capacitance of the fifth capacitor is equal to a sixth capacitance of the sixth capacitor;
   a seventh capacitance of the seventh capacitor is equal to an eighth capacitance of the eighth capacitor;
   the fifth capacitor and the sixth capacitor are connected in series to form a third capacitor branch; and
   the seventh capacitor and the eighth capacitor are connected in series to form a fourth capacitor branch, and wherein the third capacitor branch and the fourth capacitor branch are connected in parallel.

8. The device of claim 7, wherein:
the fourth capacitor block and the third capacitor block share a same structure.

9. The device of claim 8, wherein:
the third switch has a first terminal directly connected to a terminal of the third capacitor block and a second terminal directly connected to a terminal of the fourth capacitor block.

10. The device of claim 1, wherein:
the first switch and the second switch are configured to be turned on simultaneously; and
the third switch and the fourth switch are configured to be turned off simultaneously.

11. The device of claim 1, wherein:
the third switch and the fourth switch are configured to be turned on simultaneously; and
the first switch and the second switch are configured to be turned off simultaneously.

12. A device comprising:
a first block and a second block having a same capacitor configuration, wherein:
both the first block and the second block comprise two capacitor branches connected in parallel;
a first switch connected between the first block and the second block;
a third block and a fourth block having a same capacitor configuration, wherein:
both the third block and the fourth block comprise two capacitor branches connected in parallel;
a second switch connected between the third block and the fourth block;
a third switch connected between the first block and the fourth block; and
a fourth switch connected between the third block and the second block, wherein the first block, the second block, the third block, the fourth block and the switches form a variable capacitance block.

13. The device of claim 12, wherein the first block comprises:
a first capacitor and a second capacitor having a same capacitance value; and
a third capacitor and a fourth capacitor having a same capacitance value, and wherein:
the first capacitor and the fourth capacitor are connected in series to form a first capacitor branch; and
the second capacitor and the third capacitor are connected in series to form a second capacitor branch, and wherein the first capacitor branch and the second capacitor branch are connected in parallel.

14. The device of claim 12, wherein the third block comprises:
a first capacitor and a second capacitor having a same capacitance value; and
a third capacitor and a fourth capacitor having a same capacitance value, and wherein:
the first capacitor and the second capacitor are connected in series to form a first capacitor branch; and
the third capacitor and the fourth capacitor are connected in series to form a second capacitor branch, and wherein the first capacitor branch and the second capacitor branch are connected in parallel.

15. The device of claim 12, further comprising:
an inductive element having a first terminal connected to a common node of the first block and the third block and a second terminal connected to a common node of the second block and the fourth block.

16. The device of claim 15, further comprising:
a pair of transistors and a bias current source, wherein the inductive element, the variable capacitance block, the pair of transistors and the bias current source form an oscillator.

17. A method comprising:
in response to a first operation mode, turning on a first switch and a second switch, and turning off a third switch and a fourth switch, wherein:
the first switch is connected between a first capacitor block and a second capacitor block;
the second switch is connected between a third capacitor block and a fourth capacitor block;
the third switch is connected between the first capacitor block and the fourth capacitor block;
the fourth switch is connected between the second capacitor block and the third capacitor block;
the first capacitor block and the second capacitor block share a first capacitor configuration; and
the third capacitor block and the fourth capacitor block share a second capacitor configuration; and
in response to a second operation mode, turning off the first switch and the second switch, and turning on the third switch and the fourth switch.

18. The method of claim 17, further comprising:
in the first operation mode, connecting the first capacitor block and the second capacitor block to form a first capacitor branch; and
connecting the third capacitor block and the fourth capacitor block to form a second capacitor branch, and wherein the first capacitor branch and the second capacitor branch are connected in parallel.

19. The method of claim 17, further comprising:
in the second operation mode, connecting the first capacitor block and the fourth capacitor block to form a first capacitor branch; and
connecting the third capacitor block and the second capacitor block to form a second capacitor branch, and wherein the first capacitor branch and the second capacitor branch are connected in parallel.

20. The method of claim 17, wherein:
the first capacitor configuration comprises a first capacitor and a fourth capacitor connected in series, and a second capacitor and a third capacitor connected in series, and wherein:
a capacitance of the first capacitor is equal to a capacitance of the second capacitor; and
a capacitance of the third capacitor is equal to a capacitance of the fourth capacitor; and
the second capacitor configuration comprises a fifth capacitor and a sixth capacitor connected in series, and a seventh capacitor and an eighth capacitor connected in series, and wherein:
a capacitance of the fifth capacitor is equal to the capacitance of the first capacitor;
a capacitance of the sixth capacitor is equal to the capacitance of the first capacitor;
a capacitance of the seventh capacitor is equal to the capacitance of the third capacitor; and
a capacitance of the eighth capacitor is equal to the capacitance of the third capacitor.

* * * * *